(12) United States Patent
Kamath et al.

(10) Patent No.: US 8,264,027 B2
(45) Date of Patent: Sep. 11, 2012

(54) PRINTED NON-VOLATILE MEMORY

(75) Inventors: Arvind Kamath, Mountain View, CA (US); Patrick Smith, San Jose, CA (US); James Montague Cleeves, Redwood City, CA (US)

(73) Assignee: Kovio, Inc., San Jose, CA (US)

( * ) Notice: Subject to any disclaimer, the term of this patent is extended or adjusted under 35 U.S.C. 154(b) by 208 days.

(21) Appl. No.: 12/723,542

(22) Filed: Mar. 12, 2010

(65) Prior Publication Data

US 2010/0163962 A1    Jul. 1, 2010

Related U.S. Application Data

(62) Division of application No. 11/842,884, filed on Aug. 21, 2007, now Pat. No. 7,709,307.

(60) Provisional application No. 60/840,103, filed on Aug. 24, 2006.

(51) Int. Cl.
*H01L 29/788* (2006.01)
(52) U.S. Cl. ....................................................... 257/321
(58) Field of Classification Search .................. 257/316, 257/321, E21.682, E21.687, E27.103
See application file for complete search history.

(56) References Cited

U.S. PATENT DOCUMENTS

| | | | |
|---|---|---|---|
| 4,526,807 A | 7/1985 | Auerbach | |
| 4,759,947 A | 7/1988 | Ishihara et al. | |
| 4,835,005 A | 5/1989 | Hirooka et al. | |
| 5,132,248 A | 7/1992 | Drummond et al. | |
| 5,380,474 A | 1/1995 | Rye et al. | |
| 5,461,002 A | 10/1995 | Safir | |
| 5,652,019 A | 7/1997 | Moran | |
| 5,866,471 A | 2/1999 | Beppu et al. | |
| 5,953,629 A | 9/1999 | Imazeki et al. | |
| 5,989,945 A | 11/1999 | Yudasaka et al. | |
| 6,153,348 A | 11/2000 | Kydd et al. | |

(Continued)

FOREIGN PATENT DOCUMENTS

EP    0 855 614 A1    7/1998

(Continued)

OTHER PUBLICATIONS

Kazuo Yudasaka, Masahiro Furusawa, and Takashi Aoki; "Device, its Manufacturing Method and Electronic Device"; espacenet; Japanese Publication No. JP2003318193 (A); Publication Date: Nov. 7, 2003; espacenet Database—Worldwide, http://v3.espacenet.com/publicationDetails/biblio?DB=EPODOC&adjacent=true &locale=en . . . .

(Continued)

*Primary Examiner* — Matthew Landau
*Assistant Examiner* — Daniel Luke
(74) *Attorney, Agent, or Firm* — The Law Offices of Andrew D. Fortney; Andrew D. Fortney

(57) ABSTRACT

A nonvolatile memory cell is disclosed, having first and second semiconductor islands at the same horizontal level and spaced a predetermined distance apart, the first semiconductor island providing a control gate and the second semiconductor island providing source and drain terminals; a gate dielectric layer on at least part of the first semiconductor island; a tunneling dielectric layer on at least part of the second semiconductor island; a floating gate on at least part of the gate dielectric layer and the tunneling dielectric layer; and a metal layer in electrical contact with the control gate and the source and drain terminals. In one advantageous embodiment, the nonvolatile memory cell may be manufactured using an "all-printed" process technology.

20 Claims, 7 Drawing Sheets

U.S. PATENT DOCUMENTS

| | | |
|---|---|---|
| 6,215,130 B1 | 4/2001 | Dodabalapur |
| 6,232,157 B1 | 5/2001 | Dodabalapur et al. |
| 6,413,790 B1 | 7/2002 | Duthaler et al. |
| 6,503,570 B2 | 1/2003 | Matsuki et al. |
| 6,503,831 B2 | 1/2003 | Speakman |
| 6,506,438 B2 | 1/2003 | Duthaler et al. |
| 6,514,801 B1 | 2/2003 | Yudasaka et al. |
| 6,518,087 B1 | 2/2003 | Furusawa et al. |
| 6,527,847 B1 | 3/2003 | Matsuki |
| 6,541,354 B1 | 4/2003 | Shimoda et al. |
| 6,593,591 B2 | 7/2003 | Yudasaka et al. |
| 6,680,725 B1 | 1/2004 | Jacobson |
| 6,683,333 B2 | 1/2004 | Kazlas et al. |
| 6,767,775 B1 | 7/2004 | Yudasaka et al. |
| 6,864,133 B2 | 3/2005 | Aoki et al. |
| 6,884,700 B2 | 4/2005 | Aoki et al. |
| 6,900,499 B2 | 5/2005 | Yamazaki et al. |
| 6,908,796 B2 | 6/2005 | Furusawa |
| 6,911,385 B1 | 6/2005 | Haubrich et al. |
| 6,914,288 B2 | 7/2005 | Itou et al. |
| 6,917,072 B2 | 7/2005 | Noguchi et al. |
| 6,951,666 B2 | 10/2005 | Kodas et al. |
| 7,052,980 B2 | 5/2006 | Aoki |
| 7,067,337 B2 | 6/2006 | Yudasaka et al. |
| 7,282,430 B2 | 10/2007 | Karg et al. |
| 7,473,962 B2 | 1/2009 | Maruo et al. |
| 7,719,050 B1 | 5/2010 | Wang |
| 2002/0074547 A1 | 6/2002 | Yudasaka et al. |
| 2002/0100908 A1 | 8/2002 | Yudasaka et al. |
| 2002/0179906 A1 | 12/2002 | Yudasaka et al. |
| 2003/0030689 A1 | 2/2003 | Hashimoto et al. |
| 2003/0083203 A1 | 5/2003 | Hashimoto et al. |
| 2003/0087110 A1 | 5/2003 | Furusawa et al. |
| 2003/0108664 A1 | 6/2003 | Kodas et al. |
| 2003/0110978 A1 | 6/2003 | Abe et al. |
| 2003/0124259 A1 | 7/2003 | Kodas et al. |
| 2003/0134519 A1 | 7/2003 | Yudasaka et al. |
| 2003/0148024 A1 | 8/2003 | Kodas et al. |
| 2003/0161959 A1 | 8/2003 | Kodas et al. |
| 2003/0175411 A1 | 9/2003 | Kodas et al. |
| 2003/0232128 A1 | 12/2003 | Furusawa et al. |
| 2004/0029364 A1 | 2/2004 | Aoki et al. |
| 2004/0043691 A1 | 3/2004 | Abe et al. |
| 2004/0070022 A1 | 4/2004 | Itou et al. |
| 2004/0087068 A1 | 5/2004 | Yudasaka |
| 2004/0144959 A1 | 7/2004 | Conaghan et al. |
| 2004/0151014 A1 | 8/2004 | Speakman |
| 2004/0178391 A1 | 9/2004 | Conaghan et al. |
| 2004/0198040 A1 | 10/2004 | Geefay et al. |
| 2004/0248371 A1 | 12/2004 | Wang |
| 2005/0009231 A1 | 1/2005 | Karg et al. |
| 2005/0012138 A1 | 1/2005 | Endo et al. |
| 2005/0026317 A1 | 2/2005 | Sirringhaus et al. |
| 2005/0130397 A1 | 6/2005 | Bentley et al. |
| 2005/0133790 A1 | 6/2005 | Kato |
| 2005/0139893 A1 | 6/2005 | Hofmann et al. |
| 2005/0141150 A1 | 6/2005 | Bentley et al. |
| 2005/0145163 A1 | 7/2005 | Matsuki et al. |
| 2005/0153078 A1 | 7/2005 | Bentley et al. |
| 2005/0163917 A1 | 7/2005 | Renn |
| 2005/0169041 A1 | 8/2005 | Wang |
| 2005/0176183 A1 | 8/2005 | Aoki |
| 2005/0181566 A1 | 8/2005 | Machida et al. |
| 2005/0201150 A1 | 9/2005 | Wang |
| 2005/0272244 A1 | 12/2005 | Wada |
| 2005/0274986 A1 | 12/2005 | Sirringhaus et al. |
| 2006/0001053 A1 | 1/2006 | Wang |
| 2006/0001726 A1 | 1/2006 | Kodas et al. |
| 2006/0006454 A1 | 1/2006 | Wang |
| 2006/0008956 A1 | 1/2006 | Yudasaka et al. |
| 2006/0017091 A1 | 1/2006 | Wang |
| 2006/0018161 A1 | 1/2006 | Chen et al. |
| 2006/0024957 A1 | 2/2006 | Harada et al. |
| 2006/0051905 A1 | 3/2006 | Chen et al. |
| 2006/0170030 A1 | 8/2006 | Maruo et al. |
| 2006/0189076 A1 | 8/2006 | Nakajima |
| 2006/0202266 A1 | 9/2006 | Radosavljevic et al. |
| 2006/0289924 A1 | 12/2006 | Wang |
| 2007/0008778 A1 | 1/2007 | Wang |
| 2007/0281425 A1 | 12/2007 | Wang |
| 2007/0281426 A1 | 12/2007 | Wang |
| 2008/0061321 A1 | 3/2008 | Wang |
| 2008/0070390 A1 | 3/2008 | Wang |
| 2008/0203464 A1 | 8/2008 | Wang |
| 2008/0237696 A1 | 10/2008 | Wang |

FOREIGN PATENT DOCUMENTS

| | | |
|---|---|---|
| EP | 1 085 560 A1 | 3/2001 |
| EP | 1 085 579 A1 | 3/2001 |
| EP | 1 087 428 A1 | 3/2001 |
| EP | 1 113 502 A1 | 7/2001 |
| EP | 1 892 753 A2 | 2/2008 |
| JP | 60-242612 A | 12/1985 |
| JP | 7-267621 A | 10/1995 |
| JP | 8-32085 A | 2/1996 |
| JP | 11297947 A | 10/1999 |
| JP | 2003-54931 A | 2/2003 |
| JP | 2003-318119 A | 11/2003 |
| JP | 2003-318120 A | 11/2003 |
| JP | 2003-318191 A | 11/2003 |
| JP | 2003-318193 A | 11/2003 |
| JP | 2004145333 A | 5/2004 |
| JP | 2005260040 A | 9/2005 |
| JP | 2006216780 A | 8/2006 |
| TW | 413951 B | 12/2000 |
| TW | 200511622 | 3/2005 |
| TW | I239640 B | 9/2005 |
| TW | 200605334 | 2/2006 |
| TW | 200610152 | 3/2006 |
| TW | I257652 B | 7/2006 |
| WO | 00/59014 A1 | 10/2000 |
| WO | 00/59015 A1 | 10/2000 |
| WO | 00/59040 A1 | 10/2000 |
| WO | 00/59041 A1 | 10/2000 |

OTHER PUBLICATIONS

Takashi Aoki, Masahiro Furusawa, and Kazuo Yudasaka; "Device, Its Manufacturing Method, Electrooptical Device, and Electronic Device"; espacenet; Japanese Publication No. JP2003318191 (A); Publication Date: Nov. 7, 2003; espacenet Database—Worldwide, http://v3espacenet.com/publicationDetails/biblio?DB=EPODOC&adjacent=true&locale=en . . . .

Takashi Aoki, Masahiro Furusawa, and Kazuo Yudasaka; "Method for Manufacturing Device, Device and Electronic Apparatus"; espacenet: Japanese Publication No. JP2003318120 (A); Publication Date: Nov. 7, 2003; espacenet Database—Worldwide, http://v3.espacenet.com/publicationDetails/biblio?DB=EPODOC&adjacent=true&locale=en . . . .

Masahiro Furusawa and Takashi Aoki; "Silicon Film and Method for Forming the Same, Liquid Crystal Display Device, Organic El Display Device, Electronic Apparatus and Apparatus"; espacenet; Japanese Publication No. JP2003318119 (A); Publication Date: Nov. 7, 2003; espacenet Database—Worldwide, http://v3.espacenet.com/publicationDetails/biblio?DB=EPODOC&adjacent=true&locale=en . . . .

Yasuo Matsuki, Yasuaki Yokoyama, Kouji Shiho, and Hitoshi Kato; "Method for Forming Polycrystalline Silicon Film and Composition Therefor"; espacenet; Japanese Publication No. JP2003054931 (A); Publication Date: Feb. 26, 2003; espacenet Database—Worldwide, http://v3.espacenet.com/publicationDetails/biblio?DB=EPODOC&adjacent=true&locale=en . . . .

Keiji Kawasaki; "Manufacture of Thin Film Transistor"; Patent Abstracts of Japan from European Patent Office; Publication No. 08032085; Publication Date: Feb. 2, 1996; Japan Patent Office, Japan.

Kotaro Yano, Yutaka Kitsuno, Akira Sakawaki, and Keiji Kawasaki; "Formation of Silicon Membrane"; espacenet; Japanese Publication No. JP7267621 (A); Publication Date: Oct. 17, 1995; espacenet Database—Worldwide, http://v3.espacenet.com/publicationDetails/biblio?DB=EPODOC&adjacent=true&locale=en . . . .

Yukio Nishimura, Hiroshi Matsuda, Masahiro Haruta, Yutaka Hirai, Takeshi Eguchi, and Takashi Katagiri; "Deposition Film Forming Method"; espacenet; Japanese Publication No. JP60242612 (A); Publication Date Dec. 2, 1985; espacenet Database—Worldwide, http://v3.espacenet.com/publicationDetails/biblio?DB=EPODOC&adjacent=true&locale=en . . . .

Ichio Yudasaka, Tatsuya Shimoda, and Shunichi Seki; "Method of Manufacturing Thin-Film Transistor"; espacenet; PCT Publication No. WO0059040 (A1); Publication Date: Oct. 5, 2000; espacenet Database—Worldwide, http://v3.espacenet.com/publicationDetails/biblio?DB=EPODOC&adjacent=true&locale=en . . . .

Ichio Yudasaka, Tatsuya Shimoda, and Shunichi Seki; "Method of Manufacturing Thin-Film Transistor"; espacenet; PCT Publication No. WO0059041 (A1); Publication Date: Oct. 5, 2000; espacenet Database—Worldwide, http://v3.espacenet.com/publicationDetails/biblio?DB=EPODOC&adjacent=true&locale=en . . . .

Tatsuya Shimoda, Satoru Miyashita, Shunichi Seki, Masahiro Furusawa, Ichio Yudasaka, Yasumasa Takeuchi, and Yasuo Matsuki; "Method for Forming Silicon Film"; espacenet; PCT Publication No. WO0059015 (A1); Publication Date: Oct. 5, 2000; espacenet Database—Worldwide, http://v3.espacenet.com/publicationDetails/biblio?DB=EPODOC&adjacent=true&locale=en . . . .

Shunichi Seki, Tatsuya Shimoda, Satoru Miyashita, Masahiro Furusawa, Ichio Yudasaka, Yasuo Matsuki, and Yasumasa Takeuchi; "Method for Forming a Silicon Film and Ink Composition for Ink Jet"; espacenet; PCT Publication No. WO0059014 (A1); Publication Date: Oct. 5, 2000; espacenet Database—Worldwide, http://v3.espacenet.com/publicationDetails/biblio?DB=EPODOC&adjacent=true&locale=en . . . .

Korean Office Action with English Translation dated Aug. 17, 2009; Korean Patent Application No. 10-2007-0085599; 5 pgs.; Korean Intellectual Property Office, Republic of Korea.

Chinese Office Action with English Translation date stamped Jul. 24, 2009; Chinese Patent Application No. 2007101482020; 10 pgs.; The State Intellectual Property Office of P.R.C., People's Republic of China.

European Search Report; European Application No. EP 07 01 6503; Dated Mar. 9, 2009; 4 pgs.; European Patent Office, Rijswijk, Netherlands.

Jung-Hoon Oh, Hoon-Ju Chung, Nae-In Lee, and Chul-Hi Han; "A High-Endurance Low-Temperature Polysilicon Thin-Film Transistor EEPROM Cell"; IEEE Electron Device Letters; Jun. 2000; pp. 304-306; vol. 21, No. 6; IEEE.

H. Somberg; "Ink Jet Printing for Metallization on Very Thin Solar Cells"; 1990; pp. 666-667; IEEE.

Michael Quirk and Julian Serda; "Semiconductor Manufacturing Technology"; Library of Congress Cataloging-in-Publication Data; 2001; p. 336; Prentice-Hall Inc., Upper Saddle River, New Jersey, US.

Notice of Reasons for Rejection dated Jul. 5, 2011; Japanese Patent Application No. 2007218722; Japan Patent Office, Japan.

Taiwanese Office Action dated Jun. 15, 2011; Taiwanese Patent Application No. 096131418; Taiwan Intellectual Property Office, Taiwan.

Eiji Natori and Tatsuya Shimoda; "Semiconductor Element, Manufacture Therefor and Manufacturing Equipment Thereof"; Publication No. JP 11297947 (A); Publication Date: Oct. 29, 1999; Esp@cenet database; http://worldwide.espacenet.com/publicationDetails/biblio?DB=EPODOC&II=2&adjacent . . . .

Kazuo Yudasaka, Tatsuya Shimoda, Sadao Kanbe and Wakao Miyazawa; "Liquid Crystal Panel and Electronic Device Having Coating Film, Manufacturing Thin-Film Device"; Publication No. JP 2004145333 (A); Publication Date: May 20, 2004; Esp@cenet database; http://worldwide.espacenet.com/publicationDetails/biblio?DB=EPODOC&at=24&locale . . . .

Akio Machida, Takahiro Kamei and Yochiyuki Kawana; "Doping Method, Method for Manufacturing Semiconductor Device and Electronic Application Device"; Publication No. JP 2005260040 (A); Publication Date: Sep. 22, 2005; Esp@cenet database; http://worldwide.espacenet.com/publicationDetails/biblio?DB=EPODOC&II=2&adjacent . . . .

Yutaka Maruo, Susumu Inoue and Isoa Takeda; "Semiconductor Device"; Publication No. JP 2006216780 (A); Publication Date: Aug. 17, 2006; Esp@cenet database; http://worldwide.espacenet.com/publicationDetails/biblio?DB=EPODOC&II=3&adjacent . . . .

Ananth Dodabalapur; "Thin Film Transistors"; Publication No. TW 413951 (B); Publication Date: Dec. 1, 2000; Esp@cenet database; http://worldwide.espacenet.com/publicationDetails/biblio?DB=EPODOC&at=6&locale= . . . .

Heike E. Riel, Walter Reiss and Siegfried F. Karg; "High-Resolution Patterning"; Publication No. TW 200511622; Publication Date: Mar. 16, 2005; Taiwan Patent Search database; http://twpat1.tipo.gov.tw/tipotwoc/tipotwekm?00E63FA6EB72040100000000000104100 . . . .

Seiichi Endo and Motoharu Ishii; "Nonvolatile Semiconductor Memory Device"; Publication No. TW I239640 (B); Publication Date: Sep. 11, 2005; Esp@cenet database; http://worldwide.espacenet.com/publicationDetails/biblio?DB=EPODOC&II=0&adjacent . . . .

Hsin-Ming Chen, Shih-Chen Wang and Hong-Ping Tsai; "Single Poly Non-Volatile Memory"; Publication No. TW 200605334; Publication Date: Feb. 1, 2006; Taiwan Patent Search database; http://twpat1.tipo.gov.tw/tipotwoc/tipotwekm?00E63FA6EB72020100000000000104100 . . . .

Hung-Tse Chen, Yu-Cheng Chen and Chi-Lin Chen; "Method of Fabricating Planarized Poly-Silicon Thin Film Transistors"; Publication No. TW 200610152; Publication Date: Mar. 16, 2006; Taiwan Patent Search database; http://twpat1.tipo.gov.tw/tipotwoc/tipotwekm?00494E00A1DD050100000000000104100 . . . .

Chih-Hsin Wang; "Electrically Alterable Memory Cell"; Publication No. TW I257652 (B); Publication Date: Jul. 1, 2006; Esp@cenet database; http://worldwide.espacenet.com/publicationDetails/biblio?CC=TW&NR=I257652B&KC . . . .

Final Notice of Reasons for Rejection dated Nov. 29, 2011; Japanese Patent Application No. 2007218722; Japan Patent Office, Japan.

US 8,264,027 B2

PRINTED NON-VOLATILE MEMORY

RELATED APPLICATIONS

This application is a divisional application of U.S. patent application Ser. No. 11/842,884, filed on Aug. 21, 2007 now U.S. Pat. No. 7,709,307, which claims the benefit of U.S. Provisional Application No. 60/840,103, filed Aug. 24, 2006, each of which is incorporated herein by reference in its entirety.

FIELD OF THE INVENTION

The invention relates to a nonvolatile memory and methods of making and using the same. Nonvolatile memory can be manufactured using low-cost printing technology, in which MOS or thin film floating-gate transistors are fabricated by printing a doped dielectric film onto a (printed) semiconductor film, and diffusing a dopant from the doped dielectric film into the semiconductor film. The invention advantageously employs a printed thin film transistor (TFT) process flow, for example as described in U.S. Provisional Pat. Appl. Nos. 60/838,125, (filed on Aug. 15, 2006) and in U.S. patent application Ser. Nos. 11/818,078, 11/888,949 and 11/888,942 (respectively), filed on Jun. 12, 2007, Aug. 3, 2007 and Aug. 3, 2007, respectively, the relevant portions of which are incorporated herein by reference.

DISCUSSION OF THE BACKGROUND

The floating-gate transistor in non-volatile memory is a well known form of electrically erasable programmable read-only memory, or EEPROM. EEPROM devices generally include a grid or array of transistors having one or more floating gates protected by a high-quality insulator. By application of higher-than-normal electrical potentials to terminals of the EEPROM transistors, electrons become trapped on the floating gate, thereby changing the voltage at which the transistor turns on. EEPROM transistors can be reset or erased to a base state (all "1"s or "0"s, depending on the design), either electrically or optically (e.g., by applying ultraviolet [UV] light). Once packaged, the EEPROM device generally cannot be reset or erased with UV light. However, the electrical erase process has the disadvantage of degrading the charge storage capability of the device, so memory systems based on floating-gate transistors generally have finite lifetimes, on the order of $10^5$ write operations.

Flash memory is substantially identical to EEPROM, and differs largely in internal layout and/or processing logic. Flash memory is generally written and erased in blocks, rows or columns, which greatly simplifies the internal wiring and allows for higher densities. Areal density (i.e., memory storage bits per unit area) is the main determinant of cost in most memory systems, and due to this, flash memory has evolved into one of the lowest cost solid-state memory devices available.

SUMMARY OF THE INVENTION

The present invention is directed to methods of making nonvolatile memory, and thin film transistors and circuits including the same, on various substrates including but not limited to glass (e.g., quartz) sheets, wafers or slips, plastic and/or metal foils or sheets, Si wafers, etc., all of which may carry one or more additional (e.g., buffer, mechanical support, etc.) layers. Applications include, but are not limited to displays (e.g., flat panel displays, plasma displays, LCD/LED displays, electrophoretic displays, etc.), RF devices, sensors, etc.

One aspect of the invention concerns a non-volatile memory cell, comprising first and second printed semiconductor islands, at a same horizontal level and spaced a predetermined distance apart, the first printed semiconductor island comprising a control gate of the non-volatile memory cell and the second printed semiconductor island comprising source and drain terminals of the non-volatile memory cell; a gate dielectric layer on at least part of the first semiconductor island; a tunneling dielectric layer on at least part of the second semiconductor island; a floating gate on at least part of the gate dielectric layer and the tunneling dielectric layer; and a metal layer in electrical contact with the control gate and the source and drain terminals.

Another aspect of the invention concerns an integrated circuit, comprising the non-volatile memory cell and a MOS transistor comprising a third printed semiconductor island, at the same horizontal level as the first and second printed semiconductor islands; a MOS gate dielectric on at least part of the third semiconductor island; and a gate electrode on at least part of the MOS gate dielectric.

Another aspect of the invention concerns a method for making a MOS transistor and/or non-volatile memory cell, comprising printing a plurality of semiconductor islands on a substrate; forming a gate dielectric layer on at least part of a first one of the semiconductor islands and a tunneling dielectric layer on at least part of a second one of the semiconductor islands; forming a floating gate on at least part of the gate dielectric layer and the tunneling dielectric layer; forming a dielectric film on the first and second semiconductor islands and the floating gate; and forming a metal layer in electrical contact with the first and second semiconductor islands.

The present invention replaces relatively costly and time-consuming masking steps with relatively inexpensive, high-throughput printing of functional materials, such as patterned semiconductor islands, floating gates, and n- and p-type dopant source films. Optionally, the dopant dielectric film can be left in place as an interlayer dielectric, further eliminating additional dielectric deposition, patterning and/or removal steps.

DETAILED DESCRIPTION OF THE PREFERRED EMBODIMENTS

Figure 1A:
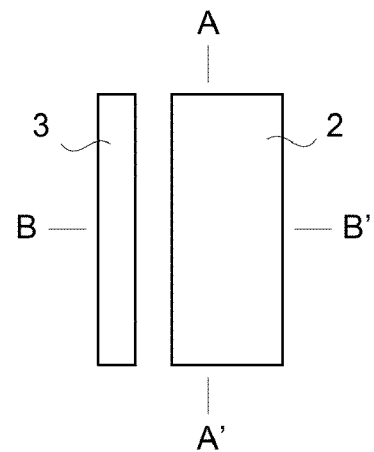
FIGS. 1A-1C show views of an initial structure in an exemplary process flow for making an exemplary embodiment of the present device, in layout (e.g., top down) view (FIG. 1A) and cross-sectional views (FIGS. 1B-1C).
Figure 1B:
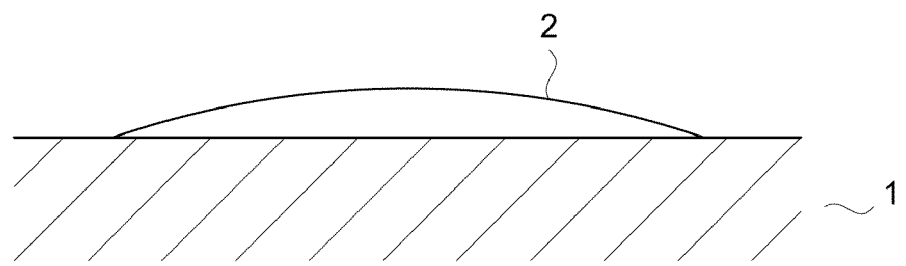
Figure 1C:
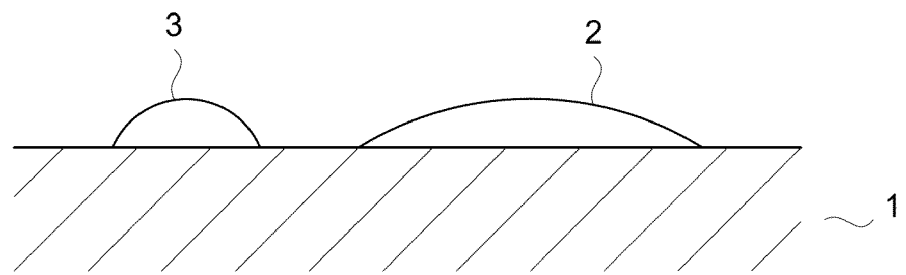

A nonvolatile memory cell according to the invention may be created using a printed TFT process flow with a single floating gate and one or two gate oxides. Two separate silicon islands may be used, one of which serves as a control gate and the other as source, drain and channel of the read transistor. The area ratio of the silicon islands to the floating gate (and to each other) may be chosen so as to achieve the desired capacitance coupling ratio(s). The device may be typically programmed using Fowler-Nordheim tunneling or hot injection of carriers across the tunnel gate oxide into the floating gate. Alternatively, a reference cell (e.g., an "unprogrammed" transistor, or one storing a "0" binary logic state) may be programmed using the opposite bias from the programmed cell (s), leading to a greater delta $V_t$ between the programmed-unprogrammed cell pairs (e.g., the "0" and "1" binary logic states), enhancing the margin over which the cell is functional, thereby increasing retention time and/or allowing operation under less stringent (e.g., subthreshold swing) conditions. Charge is retained in the floating gate, resulting in a threshold voltage shift of the programmed transistor from a reference (unprogrammed) transistor. The transistor is read using a significantly lower voltage than that used during the programming operation, such that the charge on the floating gate is not substantially disturbed. A printed TFT logic process, such as is described in any of U.S. Provisional Pat. Appl. No. 60/838,125 (filed on Aug. 15, 2006), and/or U.S. patent application Ser. Nos. 11/084,448, 11/203,563, 11/452,108, 11/805,620, 11/818,078, 11/888,949 and 11/888,942 (Jun. 12, 2006, May 23, 2007, Jun. 12, 2007, Aug. 3, 2007 and Aug. 3, 2007, respectively, the relevant portions of which are incorporated herein by reference) may be used, without extra processing steps, to manufacture the present nonvolatile memory transistors.

The present memory cell may be fabricated in part by printing a silicon ink to form the active transistor layer(s). As an enhancement, sequential lateral laser solidification and/or crystallization of printed islands of silicon can improve carrier mobility and gate oxide interface quality. This in turn significantly improves the TFT subthreshold slope (steeper turn on characteristics), which allows for a better separation between the zero and one states. Device feasibility has been demonstrated with excellent retention using a film made from a spun-on silicon ink and a printed/conventional TFT process flow (e.g., as described in one or more of the above-cited patent applications), with no extra processing steps required.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure, numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(poly)silane" refers to compounds or mixtures of compounds that consist essentially of (1) silicon and/or germanium and (2) hydrogen, and that predominantly contain species having at least 15 silicon and/or germanium atoms. Such species may contain one or more cyclic rings. In a preferred embodiment the (poly)silane has a formula $Si_xH_y$, where x is from 3 to about 200, and y is from x to (2x+2), where x may be derived from an average number molecular weight of the silane. The term "(cyclo)silane" refers to compounds or mixtures of compounds that consist essentially of (1) silicon and/or germanium and (2) hydrogen, and that may contain one or more cyclic rings and less than 15 silicon and/or germanium atoms. The term "hetero(cyclo)silane" refers to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent and that may contain one or more cyclic rings. "Liquid-phase" generally describes one or more materials that, alone or in combination, are in the liquid phase at an ambient temperature (e.g., from about 15° C. to about 25° C.). Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width).

The invention is particularly applicable to printed silicon, metal silicide or refractory metal structures in an "all-printed" process flow. Polysilicon, metal silicides (e.g. Ni-, Pt-, Pd, Co-, Ti, W, Mo-silicides and others) and/or refractory metals such as Pd, W or Mo, etc., are suitable for such structures. The "all-printed" aspect also allows the use of printed (e.g., ink-jetted) doped dielectrics as dopant sources in a self-aligned flow. An exemplary description of a suitable processing flow for making devices in accordance with the invention follows.

An Exemplary Process for a Partially or Fully Printed Nonvolatile Memory Cell FIGS. 1A-5B show an exemplary process flow for making printed non-volatile memory (e.g., an "all-printed" EEPROM transistor). FIGS. 1A-1C show a substrate 1 (not shown in FIG. 1A) with a control gate 2 and transistor island 3 thereon. FIG. 1B is a cross-sectional view of the structure of FIG. 1A along axis A-A', and FIG. 1C is a cross-sectional view of the structure of FIG. 1A along axis B-B'.

Substrate 1 generally comprises a conventional mechanical support structure, which may be electrically inert or active, and which may further include one or more advantageous and/or desired electrical and/or optical properties. Suitable electrically inert or inactive substrates may comprise a plate, disc, and/or sheet of a glass, ceramic, dielectric and/or plastic. Alternatively, suitable electrically conductive substrates may comprise a wafer, disc, sheet and/or foil of a semiconductor (e.g., silicon) and/or a metal. In the case where the substrate comprises a metal sheet and/or foil, the device may further comprise an inductor and/or capacitor, and the method may further comprise forming an inductor and/or capacitor from the metal substrate. However, any such electrically conductive substrate should have an insulator layer between it and any electrically active layer or structure thereover, except in a location where electrical contact is to be made from the structures and/or devices on the insulator to a structure formed in the metal substrate (e.g., one or more metal pads of an interposer, an inductor and/or capacitor; see, e.g., U.S. patent application Ser. Nos. 10/885,283, 11/104,375 and 11/243,460, respectively filed on Jul. 6, 2004, Apr. 11, 2005, and Oct. 3, 2005, the relevant portions of which are incorporated herein by reference).

Preferably, the substrate 1 comprises a member selected from the group consisting of a silicon wafer, a glass plate, a ceramic plate or disc, a plastic sheet or disc, metal foil, a metal sheet or disc, and laminated or layered combinations thereof. For example, plastic substrates may further contain a planarization layer thereon to reduce the surface roughness of the substrate, and glass, steel and plastic substrates may further contain a surface energy modifying layer of material thereon to improve the adhesion and/or control the spreading of a material (e.g., an ink) printed or otherwise deposited thereon (see U.S. Provisional Application No. 60/919,290, filed on Mar. 20, 2007). In addition, the electrically conductive substrates (e.g., comprising or consisting essentially of a metal) generally have an insulator layer (e.g., a layer of the corresponding metal oxide) and/or a substantially amorphous conductive layer (e.g., a transition metal nitride, such as titanium nitride, tantalum nitride, or tungsten nitride) thereon.

In one embodiment, semiconductor islands 2 and 3 are formed by printing or coating molecular and/or nanoparticle-based semiconductor inks, which in the case of printing can use the same or different inks, then converting them to thin films (e.g., by heating and/or curing). In the case where the molecular-based semiconductor ink comprises a (poly)silane and/or (cyclo)silane, and where the nanoparticle-based semiconductor ink comprises silicon nanoparticles, the semiconductor thin film comprises a (poly)silicon film. Of course, inks comprising both (i) a (poly)silane and/or (cyclo)silane, and (ii) silicon nanoparticles are perfectly suitable. In general, printing may comprise inkjet printing ("inkjetting"), screen printing, gravure printing, offset printing, flexography (flexographic printing), spray-coating, slit coating, extrusion coating, meniscus coating, microspotting, pen-coating, stenciling, stamping, syringe dispensing and/or pump dispensing the semiconductor ink in a predefined pattern onto substrate 1. In certain preferred embodiments, printing comprises inkjetting, gravure printing, offset printing, or flexography.

Forming the semiconductor thin film layers 2 and 3 may thus include printing a semiconductor precursor ink onto substrate 1 (generally having a dielectric material on the deposition surface) to form a pattern, drying the ink, curing the ink (generally by heating and/or annealing the dried ink for a length of time sufficient to cross-link, oligomerize and/or polymerize the silane, and/or increase an average molecular weight, increase a viscosity and/or reduce a volatility of the composition), then partially or substantially completely crystallizing the semiconductor film pattern to form a polycrystalline (e.g., polysilicon) film. Techniques for local printing of a liquid semiconductor precursor ink directly onto a substrate (or surface film thereof) to form a semiconductor layer such as control gate 2 and/or island 3 are described in U.S. Pat. No. 7,152,804 and in copending U.S. patent application Ser. Nos. 10/616,147, 10/949,013, 11/084,448 and 11/203,563, filed on Jul. 8, 2003, Sep. 24, 2004, Mar. 18, 2005 and Aug. 11, 2005, respectively, the relevant portions of which are incorporated herein by reference. This latter approach to forming MOS TFT structures may be cost effective due to (i) the efficient usage of the semiconductor precursor materials and (ii) the combination of semiconductor deposition and patterning into one printing step. In some embodiments, printing (or otherwise depositing) the semiconductor ink may be accompanied by substantially simultaneous or immediately subsequent irradiation with light (in one embodiment, UV light), generally at a wavelength and/or in a dose sufficient to cross-link the silicon-containing components of the ink, improve adhesion of the film to the substrate, and/or improve the film morphology (e.g., provide a desired cross-sectional shape). A substantial advantage of the present process is that the printed semiconductor island may have a tapered, dome-like cross-sectional shape, allowing for conformal formation of gate dielectric through deposition or thermal oxidation. Thus, sharp points, which serve to inhibit oxide growth or which can give rise to undesirable issues for conformal deposition of subsequent materials, are avoided, thereby substantially eliminating certain failure modes for data retention loss through locally enhanced fields across the gate dielectric by enhanced leakage and/or breakdown. Such data retention loss tends to occur at points where the (floating) gate crosses over the edge of the semiconductor island.

Forming a plurality of semiconductor islands may be done by printing a liquid-phase semiconductor ink, preferably an ink that comprises a liquid-phase (poly)- and/or (cyclo)silane in an amount of from 1 to 50 wt. % of the ink, and a solvent in which the silane is soluble, optionally in the presence of or onto a crystallization promoter such as Au, Ni, Al, etc. Typically, although not necessarily always, liquid-phase semiconductor inks further comprise a solvent, preferably a cycloalkane. Thus, when using an ink comprising or consisting essentially of a Group IVA element source (such as a silane-based precursor to Si or doped Si), forming the semiconductor layer (e.g., 2-3 in FIGS. 1A-1C) may further comprise drying the liquid-phase precursor ink after deposition. See copending U.S. application Ser. Nos. 10/616,147, 10/789,317 and 10/789,274, respectively filed Jul. 8, 2003, Feb. 27, 2004 and Feb. 27, 2004 (respectively), the relevant portions of each of which are incorporated herein by reference. In one embodiment, the silane has the formula $Si_xH_y$, where x is from 3 to 1000, and y is from x to (2x+2), where x may be derived from an average number molecular weight of the silane. The semiconductor ink may further comprise silicon nanocrystals, which may be passivated with one or more ligands selected from the group consisting of alkyl groups, aralkyl groups, alcohols, alcoholates, thiols, thiolates, hydrogen and/or carboxylates (see, e.g., U.S. patent application Ser. No. 10/616, 147, filed on Jul. 8, 2003, the relevant portions of which are incorporated herein by reference).

Representative cyclosilane compounds of the formula $(AH_z)_k$ wherein A is Si, z is 1 or 2 (preferably 2) and k is from 3 to 12 (preferably 4 to 8) and an exemplary method for their preparation are described in greater detail in copending application Ser. No. 10/789,317, filed Feb. 27, 2004, the relevant portions of which are incorporated herein by reference. Alternatively, one or more of the A atoms may be Ge. Representative hetero(cyclo)silane compounds, doped silane intermediates, doped silane compositions, exemplary methods for their preparation, and techniques for determining and/or controlling the dopant levels in the precursor inks and active films are described in greater detail in copending U.S. patent application Ser. Nos. 10/950,373, 10/949,013, and 10/956,714, respectively, filed on Sep. 24, 2004, Sep. 24, 2004, and Oct. 1, 2004, and respectively, the relevant portions of which are incorporated herein by reference). Representative oligo- and polysilane compounds are disclosed in U.S. Provisional Appl. Nos. 60/850,094 and 60/905,403, filed Oct. 6, 2006 and Mar. 5, 2007, respectively, the relevant portions of which are incorporated herein by reference.

After deposition (and generally, at least some drying), a semiconductor layer is generally cured by heating, as described above in copending U.S. patent application Ser. No. 10/789,274 and 10/949,013 (respectively, filed on Feb. 27, 2004 and Sep. 24, 2004, the relevant portions of which are incorporated herein by reference) to form an amorphous, hydrogenated (doped) semiconductor (e.g., a-Si:H) layer. When a semiconductor layer originates or is formed from a (cyclo)- and/or (poly)silane and/or hetero(cyclo)- and/or -(poly)silane, the curing/heating step may remove unwanted precursor/ink components or byproducts such as volatile carbon-containing species, or reduce the hydrogen content of the amorphous, hydrogenated semiconductor (e.g., a-Si:H) layer (which is particularly advantageous if laser crystallization is to be used after semiconductor film formation). When a semiconductor layer originates or is formed from a hetero(cyclo)- and/or -(poly)silane, the curing/heating step may also activate part of the dopant in the hetero(cyclo) silane, but in many embodiments, dopant activation may be more likely to occur during a subsequent laser crystallization step.

Alternatively, one may conventionally deposit a semiconductor film (e.g., by evaporation, physical vapor deposition, sputtering of an elemental target, or chemical vapor deposition [e.g., PECVD, LPCVD, etc.], optionally in the presence of or onto a crystallization promoter such as Au, Ni, Al, etc.) and crystallize part or all of the semiconductor film by (UV) laser exposure, furnace or RTA anneal (e.g., in the case where the semiconductor film comprises or consists essentially of a Group IVA element), then pattern the polycrystalline film by (low-resolution) photolithography. Alternatively, one may "blanket deposit" the semiconductor film by spin-coating an ink comprising, e.g., a (cyclo)silane and/or semiconductor nanoparticles (which may be passivated) and a solvent, and curing the ink (see, e.g., U.S. patent application Ser. Nos. 10/616,147 and 10/749,876, filed on Jul. 8, 2003 and Dec. 31, 2003, respectively, the relevant portions of which are incorporated herein by reference). In general, "low-resolution photolithography" refers to photolithography having a minimum line width on the order of microns (e.g., 1 μm, 2 μm, 5 μm or more), as opposed to submicron photolithography. When the semiconductor film is crystallized by laser annealing, one may simply remove the non-irradiated, amorphous portions of the deposited film by selective etching in accordance with known techniques.

In various embodiments, semiconductor layers 2 and 3 comprise or consist essentially of a lightly doped inorganic semiconductor material, such as one or more Group IVA elements (e.g., silicon and/or germanium), a so-called "III-V" material (e.g., GaAs), a II-VI (or chalcogenide) semiconductor, etc., which may further contain a dopant (such as B, P, As or Sb) in a concentration of from ~$10^{16}$ to ~$5 \times 10^{18}$ atoms/cm$^3$. In a preferred embodiment, the semiconductor thin film layers 2 and 3 generally comprise or consist essentially of one or more Group IVA elements, preferably silicon or silicon-germanium.

In one embodiment, the semiconductor channel island 3 may be lightly doped (e.g., having a dopant concentration of from about $10^{16}$ to about $10^{18}$ atoms/cm$^3$). Exemplary lightly doped semiconductor films and methods of forming the same are disclosed in copending U.S. application Ser. Nos. 10/950,373, 10/949,013 and 10/956,714, respectively filed on Sep. 24, 2004, Sep. 24, 2004 and Oct. 1, 2004, the relevant portions of which are incorporated herein by reference. When formed from a silane-based ink, the lightly doped semiconductor film may have a concentration profile (e.g., dopant concentration as a function of semiconductor layer thickness) in an amorphous state that is substantially uniform throughout substantially the entire thickness of the semiconductor layer.

Typical thicknesses for semiconductor layers 2 and 3 may be from about 10, 25, 50, or 100 nm to about 200, 500 or 1000 nm, or any range of values therein. The film thickness may be chosen to optimize the electrical properties of the non-volatile memory transistor. In addition, semiconductor layers 2 and 3 may have a width (e.g., the longest dimension shown in the cross-section A-A' of FIGS. 1A-1B) of at least 5, 8 or 10 μm, up to 50, 100, or 200 μm or more, or any range of values therein. The channel island 3 may have a length (e.g., the horizontal dimension shown in FIG. 1C) of at least 1, 2, 5, 10 or 20 μm, up to 20, 50 or 100 μm or more, or any range of values therein.

Each of the first and second semiconductor islands 2 and 3 has an area defined by a width and a length. Preferably, the width and/or length of the first semiconductor island (e.g., control gate 2) is substantially equal to at least one of the width and/or length of the second semiconductor island (e.g., channel island 3), as shown in FIG. 1A. The predetermined distance between the islands is from 1 to 50 μm, preferably from 2 or 5 μm to 20 or 25 μm (or any range of values therein).

As described above (at least in part), the printed (or deposited) and cured semiconductor islands 2 and 3 may be further (re)crystallized by sequential lateral solidification (SLS) and/or laser crystallization to improve carrier mobility and gate oxide interface quality. Such (re)crystallization may significantly improve the TFT subthreshold slope (e.g., provide steeper turn on characteristics), which allows for a better separation between the zero and one states stored in the memory cell.

Figure 2A:
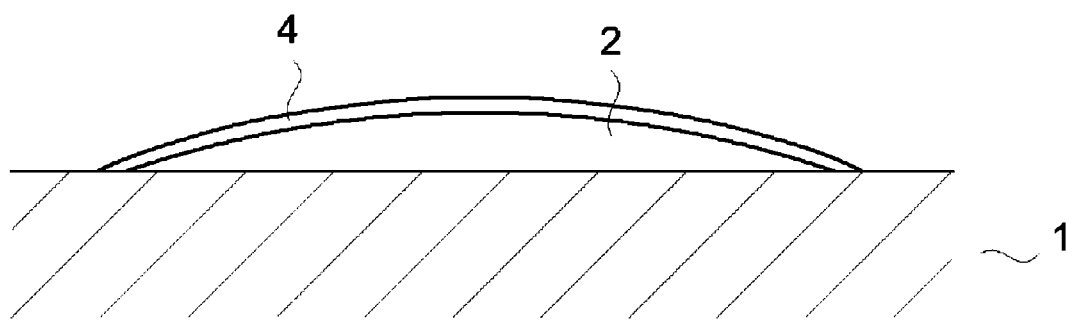
FIGS. 2A-2B show cross-sectional views of an intermediate structure in the exemplary process flow.
Figure 2B:
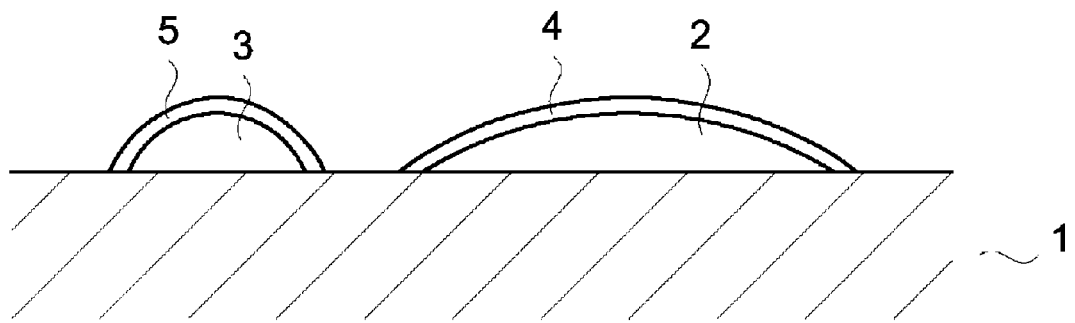

FIGS. 2A-2B show the formation of dielectric layers 4 and 5 on the control gate 2 and transistor island 3. FIG. 2A is a cross-sectional view along axis A-A' of a structure as shown in FIG. 1A (see, e.g., FIG. 1B), and FIG. 2B is a cross-sectional view along axis B-B' of a structure as shown in FIG. 1A (see, e.g., FIG. 1C).

Referring to FIG. 2B, dielectric layers 4 and 5 may be the same or different. By doping the control gate 2 and channel island 3 differently, different (doped) oxides and/or different oxide thicknesses can be grown thereon, as is known in the art. Dielectric layers 4 and 5 can be formed by plasma-enhanced chemical vapor deposition (PE-CVD), low pressure, atmospheric pressure or high pressure chemical vapor deposition (LPCVD, APCVD, and HPCVD, respectively), thermal oxidation in an atmosphere containing an oxidizing and/or nitriding agent (e.g., dioxygen, ozone, water vapor, dinitrogen, nitrous oxide, nitric oxide, NO, ammonia, a combination thereof, etc.), chemical (bath) deposition of a metal oxide (e.g., $SiO_2$ from aqueous hydrosilicic acid, $H_2SiF_6$), liquid phase deposition of a dielectric film precursor and subsequent conversion to a dielectric film, atomic layer deposition, or a combination thereof. Thus, in various embodiments, forming the gate dielectric layer 4 and the tunnel dielectric layer 5 may comprise plasma or low-pressure chemical vapor deposition of the dielectric layer, thermal oxidation of a surface of the control gate 2 and semiconductor island 3, or liquid phase or chemical bath deposition of gate and tunnel dielectric precursors onto the control gate 2 and transistor island 3.

Thus, in various embodiments of the present method, the gate dielectric layers 4 and 5 may comprise a plurality of layers and/or be formed on all of the plurality of semiconductor islands 2 and 3. Alternatively, however, a preferred embodiment of the present invention comprises forming a gate dielectric layer (e.g., 4 and/or 5) on or over at least a subset of a plurality of semiconductor islands 2 or 3. Semiconductor islands not having a dielectric layer formed thereon may be used for devices such as diodes (e.g., Schottky diodes), resistors, etc.

Alternatively, when semiconductor island 2 or 3 comprises a Group IVA element (particularly silicon) and the substrate 1 is sufficiently thermally stable or tolerant, oxidation of the silicon-containing film can be accomplished by heating the film in a suitable atmosphere (air, $O_2$, ozone, $N_2O$ or steam, or combinations thereof) to a temperature higher than about 600° C., preferably at least about 800° C., more preferably at least about 850° C. The maximum temperature may be about 1000-1100° C., more preferably about 900° C., to reduce, inhibit or prevent thermal damage (if any) to the substrate and/or films or structures thereon. In such an embodiment, a stainless steel film, sheet or foil may be a particularly advantageous choice for the substrate 1. The gate dielectric film 4 or 5 may have a thickness of from 20 Å to 400 Å or any range of values therein (e.g., from 30 to 300 Å, or from 50 to 200 Å, etc.). The higher temperature processes enabled by a stainless steel foil typically enable substantially enhanced gate dielectric properties, including lower defect rates, a lower number/concentration of interface states and lower leakage, which translates to superior subthreshold swing, carrier mobility and data retention.

Figure 3A:
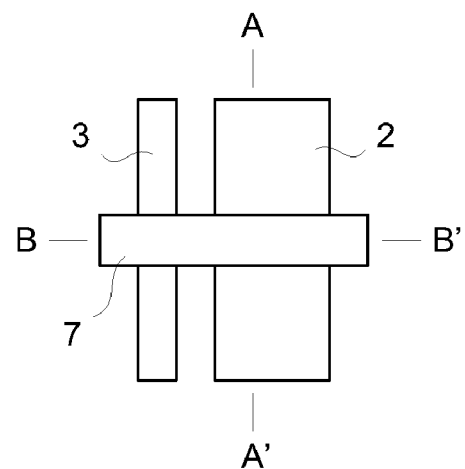
FIGS. 3A-3C show views of a successive intermediate structure in the exemplary process flow for making an exemplary embodiment of the present device, in layout view (FIG. 3A) and cross-sectional views (FIGS. 3B-3C).
Figure 3B:
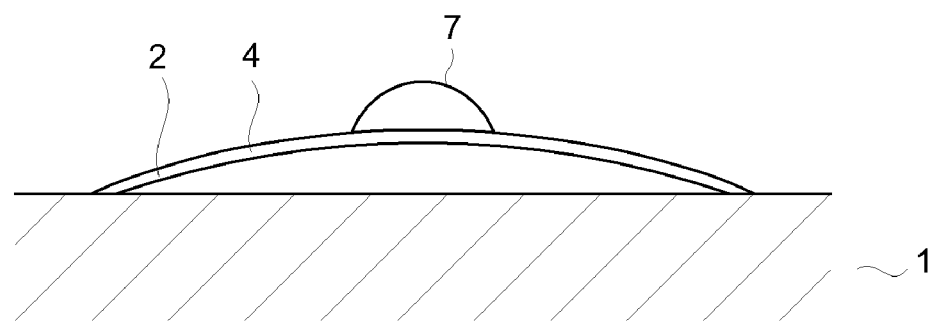
Figure 3C:
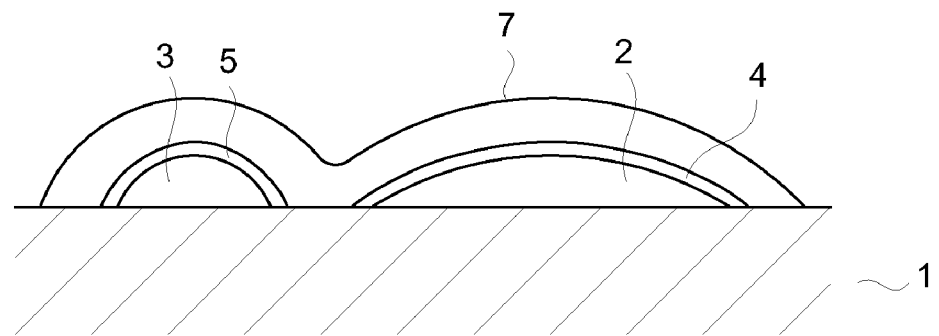

As shown in FIGS. 3A-3C, the present method may further comprise forming a floating gate 7 on the gate dielectric layers 4 and 5 and on or over some or all of the plurality of semiconductor islands 2 and 3. FIG. 3A shows a top-down (layout) view of control gate 2 and transistor island 3, with floating gate 7 thereon. FIG. 3B is a cross-sectional view of the structure of FIG. 1A along axis A-A', and FIG. 3C is a cross-sectional view of the structure of FIG. 3A along axis B-B'.

The floating gate 7 may be formed by printing a suitable precursor (e.g. metal nanoparticles or organometallic compound(s), doped molecular and/or nanoparticle-based silicon ink(s), silicide precursor ink(s), etc.), then converting it to a floating gate conductor, suitable for storing electrical charge. Use of doped silicon inks may further require and/or benefit from high temperature annealing and/or laser irradiation to form polycrystalline silicon and/or to activate the dopant to achieve sufficient electrical properties (e.g., conductivity). Alternatively, a seed layer precursor may be printed on the gate dielectric layers 4 and 5, and a floating gate metal (e.g. Ag, Au, Cu, Pd, Pt, etc.) may be electro- or electrolessly plated onto the seed layer. In some embodiments, the seed layer may require and/or benefit from an activation and/or annealing step before the plating process. Thus, forming the floating gate 7 may comprise printing a seed layer on the gate dielectric layers 4 and 5, then electro- or electrolessly plating a floating gate material on the seed layer.

In various embodiments, the floating gate 7 may comprise a printed material, generally made of doped polysilicon, a metal silicide or a refractory metal. In one embodiment, the floating gate 7 comprises a doped Group IVA element. In one implementation, the doped Group IVA element comprises polysilicon containing an N-type dopant. Preferably, the N-type dopant comprises phosphorous. In other embodiments, the floating gate 7 comprises a metal silicide selected from the group consisting of nickel silicide, cobalt silicide, palladium silicide, platinum silicide, titanium silicide, tungsten silicide, and molybdenum silicide. In still further embodiments, the floating gate 7 comprises a refractory metal selected from the group consisting of palladium, tungsten, and molybdenum. In yet another embodiment, the floating gate 7 comprises aluminum.

Printing the floating gate precursor 7 and/or seed layer may include any of the printing techniques described above for forming the semiconductor islands 2 and 3 (e.g., ink-jetting, gravure printing, offset lithography, etc.). Alternatively, patterning the floating gate 7 may include coating or printing the floating gate precursor and locally exposing it to laser radiation such that the radiated portion changes its solubility characteristics in the exposed areas. Upon washing away the exposed or unexposed area (depending on whether the precursor is a positive or negative patternable material), the floating gate material (or its precursor) stays behind to form the floating gate 7, optionally after an additional curing or annealing step. This embodiment may provide advantages for the patterning of high-resolution metal gates which may not directly be achievable with direct printing methods (see, e.g., copending U.S. patent application Ser. No. 11/203,563, filed on Aug. 11, 2005, the relevant portions of which are incorporated herein by reference).

In the case of polysilicon, the silicon precursor ink may comprise a (poly)silane, (cyclo)silane and/or silicon nanocrystals (each of which may be present in an amount of, e.g., from 1 to 50 wt. % of the ink, or any range of values therein, such as 5 to 20 wt. %) and a solvent in which the silane and/or silicon nanocrystals are soluble. The silicon nanocrystals may be passivated and/or functionalized to enable light-based processing (e.g., laser writing; see, e.g., U.S. patent application Ser. Nos. 10/616,147, 10/749,876, 10/789,317, 11/084,448 and 11/203,563, filed on Jul. 8, 2003, Dec. 31, 2003, Feb. 27, 2004, Mar. 18, 2004, and Aug. 11, 2005, respectively, the relevant portions of each of which are incorporated herein by reference). Preferably, the silane ink compounds (optionally comprising Ge atoms) may optionally be doped as disclosed in U.S. patent application Ser. Nos. 10/949,013, 10/950,373, and 10/956,714, filed on Sep. 24, 2004, Sep. 24, 2004, and Oct. 1, 2004, respectively; the relevant portions of each of which is incorporated herein by reference). After printing, the printed silane ink is cured to form (optionally doped) amorphous silicon films. Such films can be further crystallized using conventional methods (e.g., laser, furnace or metal-induced crystallization) to form (optionally doped) polycrystalline silicon. In case of undoped poly-Si gate patterns, doping may be accomplished by implantation, or more preferably, by doping from a printed doped oxide (see the description herein) to form the printed floating gate 7. Such silane inks and processes of making and using the same can also be used to form the semiconductor islands 2 and 3, as may the sequential lateral solidification (SLS) and/or laser crystallization techniques for (re)crystallizing the printed floating gate 7, but the effect on carrier mobility, oxide interface quality, and subthreshold slope may be less significant than for the semiconductor islands 2 and 3.

In the case of a metal silicide floating gate 7, the precursor ink may comprise nanoparticles and/or molecular, oligomeric and/or polymeric compounds of silicon and silicide forming metals (e.g. Ni, Co, Pd, Pt, Ti, W, Mo etc.), in the same loading (e.g., weight %) as the silane/silicon ink above. The metal atom/Si atom ratio in the silicide precursor ink may range from 10/1 to 1/10. Preferably, the ink comprises (poly)- and/or (cyclo)silane compounds as mentioned above and nanoparticles (see the next paragraph) and/or organometallic compounds of silicide forming metals (e.g., $Ni(PPH_3)_4$, $Ni(COD)_2$, $Ni(PF_3)_4$, etc., for example to facilitate formation of low resistance contacts). Thus, in one embodiment, the floating gate precursor ink may comprise (i) a (poly)silane, (ii) metal nanoparticles and/or an organometallic compound, and (iii) a solvent in which the (poly)silane and the metal nanoparticles and/or the organometallic compound are soluble. After printing the silicide precursor ink, the printed film is cured and annealed under conditions (atmosphere, temperature and time) which facilitate the formation of the intended metal silicide (and/or phase thereof).

In the case of a metal-containing floating gate 7, a metal-containing ink may comprise or consist essentially of a metal precursor material and a solvent in which the metal precursor material is soluble. Metal precursors that are generally compatible with printing or (selective) plating may comprise compounds or nanoparticles (e.g., nanocrystals) of a metal such as titanium, copper, silver, chromium, molybdenum, tungsten, cobalt, nickel, gold, palladium, platinum, zinc, iron, etc., or metal alloys thereof. Thus, the metal precursor ink may comprise nanoparticles and/or molecular or oligomeric compounds of refractory metals (e.g., Pd, Mo, W, etc.), in the same loading (e.g., weight %) as the silane/silicon ink above. Examples of molecular or oligomeric metal compounds include carboxylate, acetylacetonate, allyl, phosphine, carbonyl, and/or other ligand complexes of such metals. In the case of Pd, inks including solubilized palladium halides ($PdCl_2$ in aqueous HCl and a polar or water-soluble organic solvent, which may be dried to remove some or all of the water) can be used. See U.S. Provisional Patent Appl. No. 60/932,392, filed May 30, 2007, the relevant portions of which are incorporated herein by reference. Metal nanoparticles or nanocrystals may be conventionally passivated (e.g., with one or more surfactants, ligands or substituent groups as described herein) or unpassivated. The metal floating gate 7 may be formed as a mixture of two or more metals, or as laminated layers (as may the semiconductor and metal silicide floating gates), and may be further heated or otherwise thermally processed during or after formation of successive layers. After printing the refractory metal precursor ink, the printed film is cured and annealed under conditions (e.g., atmosphere, temperature and time) which facilitate the formation of the intended refractory metal (and/or phase thereof).

The metal- and/or silicon-containing ink may be dried by conventional and/or otherwise known processes. For example, precursor inks may be dried by heating the substrate containing the printed precursor ink thereon at a temperature and for a length of time effective to remove the solvent and/or binder. Suitable temperatures for removing solvents from a printed ink may range from about 80° C. to about 150° C., or any range of temperatures therein (e.g., from about 100° C. to about 120° C.). Suitable lengths of time for removing solvents from a printed ink at such temperatures may ranges from about 10 seconds to about 10 minutes, or any range of times therein (e.g., from about 30 seconds to about 5 minutes, or about 1 minute to 3 minutes, etc.). Such heating may take place on a conventional hotplate or in a conventional furnace or oven, optionally in an inert atmosphere (as described above).

The dried precursor material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying gate oxide 4 and/or tunnel oxide 5. When the metal-containing ink is globally (blanket) deposited or printed, annealing is generally conducted to form a metal film on which a resist is deposited for subsequent (laser) patterning. Also, when laser direct-writing a metal precursor ink results in a patterned metal and/or metal precursor, annealing is generally performed to form a metal layer with improved properties (e.g., conductivity, adhesion, etc.). Such annealing may comprise either annealing of already-fused metal nanoparticles, or converting a patterned metal precursor layer into a patterned metal. Suitable temperatures generally range from about 100° C. to about 300° C., or any range of temperatures therein (e.g., from about 150° C. to about 250° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere (as described above). Thus, the present method may further comprise the step of annealing the laser patterned metal gate sufficiently to improve its electrical, physical and/or adhesive properties.

Metal inks that may be deposited by spin-coating or printing include precursors of elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, Mo—W alloys, aluminum-titanium alloys, etc.; and electrically conductive metal compounds, such as the nitrides and silicides of elemental metals (e.g., titanium nitride, titanium silicide, tantalum nitride, cobalt silicide, molybdenum silicide, tungsten silicide, platinum silicide, etc.). For example, suitable precursors of elemental aluminum include aluminum nanoparticles and aluminum hydrides. In some embodiments, the metal may by blanket deposited by spin-coating an ink containing the metal-containing material and curing or annealing the metal, organometallic precursor(s) and/or metal nanoparticles (optionally before a laser patterning step).

Plating may comprise, in one example, printing or laser writing a seed layer of metal (e.g., Pd) using nanoparticle- and/or compound-based metal ink (e.g., the $PdCl_2$-containing ink described above), then selectively depositing (e.g., by electroless or electroplating) a bulk conductor (e.g., Co, Ni, Cu, Pd, etc.) onto the metal seed layer. In addition to the $PdCl_2$-containing ink, metal nanoparticles comprising cobalt, nickel, platinum, palladium, titanium, tungsten or molybdenum (particularly palladium) are preferred for the seed layer.

In certain embodiments, laser writing or laser patterning may comprise the substeps of depositing a resist material on the blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (in this case, gate metal 20; note that these steps apply to both positive and negative resists), removing those portions of the blanket deposited material not corresponding to the desired or predetermined pattern (typically by dry or wet etching), and removing the remaining resist material. Preferably, the light has a wavelength in the infrared (IR) band (although it could also comprise a wavelength or wavelength band in the ultraviolet (UV) and/or visible band of the spectrum), the resist (or dye) absorbs and/or is sensitive to that wavelength or band of light, and the light beam is focused on or directed at the desired or predetermined portions of the resist.

In one alternative of laser writing, a thermal resist may be advantageously used to mask the floating gate metal. Irradiation of the thermal resist with a relatively narrow laser beam (e.g., 2-5 µm wide, or by passing more diffuse light through a mask configured to define structures of such width) from a laser heats the resist and changes its solubility characteristics in a conventional developer that is used to remove the irradiated (written) or non-irradiated (unwritten) portions of the resist, depending on whether the resist is positive- or negative-acting, respectively. Such resists are generally available commercially from Creo Inc., Burnaby, British Columbia, Canada. Preferred thermal resists include Graviti Thermal Resist (Creo) and the American Dye Sources Thermolak series. The resist may also comprise a conventional (photo) resist material having an infrared (IR) light-absorbing dye therein. Preferred (photo)resists include AZ1518 (AZ Electronic Materials) and SPR220 (Shipley), and preferred infrared (IR) light-absorbing dyes include American Dye Source 815EI, 830AT, 830WS and 832WS, Avecia Projet 830NP and 830 LDI, Epolin Epolight 4148, 2184, 4121, 4113, 3063 and 4149, HW Sands SDA5303 and SDA4554. After development, metal (or metal precursor) material outside of the (predetermined) gate pattern may be removed by wet or dry etching. Wet etching may also advantageously undercut the resist to provide an even narrower gate and/or transistor channel width than would be possible using dry etching.

In various embodiments, the floating gate 7 has a width of at least 0.1 microns, 0.5 microns, 1 micron, or 2 microns. In one implementation, the minimum gate width is about 5 microns. The floating gate 7 may have a length of from about 1 µm to about 1000 µm or any range of values therein (e.g., from about 2 µm to about 200 µm, or from about 5 µm to about 100 µm, etc.), and a thickness of from about 50 nm to about 10,000 nm or any range of values therein (e.g., from about 100 to about 5000 nm, or from about 200 to about 2000 nm, etc.). The floating gate 7 may also have a thickness of from 10 to 1000 nm or any range of values therein (e.g., from 100, 200, or 250 Å to 10,000, 1000, or 500 Å). After forming the floating gate, exposed portions of the gate dielectric layer 4 and the tunnel dielectric layer 5 may be conventionally removed (e.g., by wet or dry etching; see, e.g., FIG. 6A, discussed below).

Figure 4A:
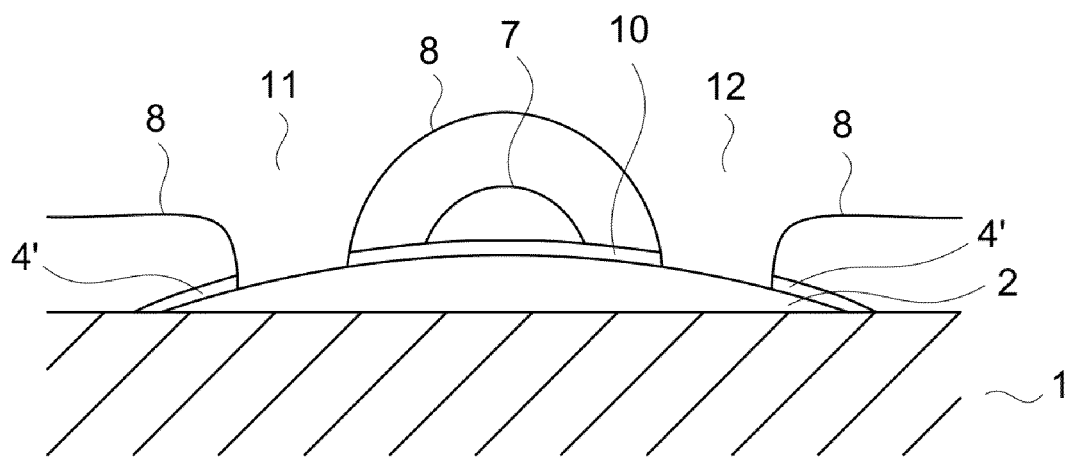
FIGS. 4A-4B show cross-sectional views of a successive intermediate structure in the exemplary process flow.
Figure 4B:
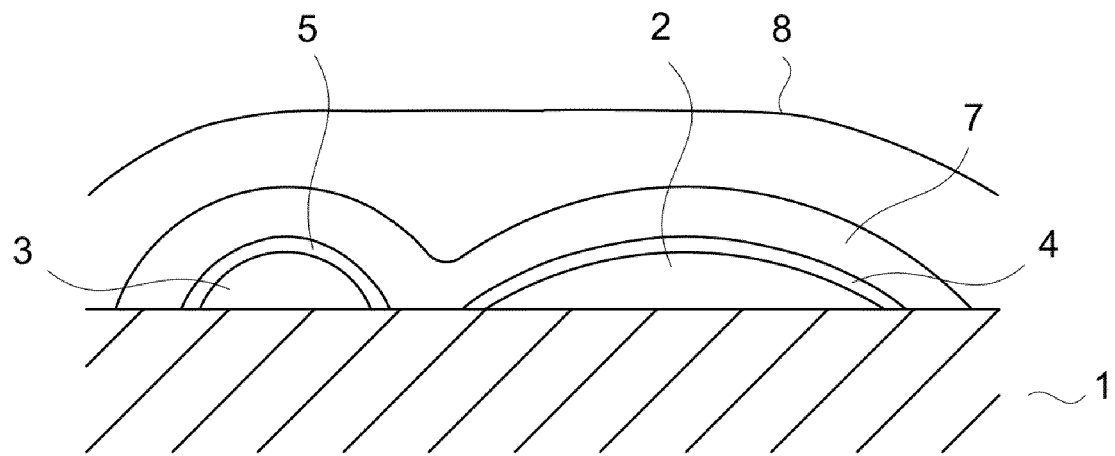

Referring to FIG. 4A-B, in one embodiment, a first doped dielectric layer (ILD) 8 may be printed or deposited on the floating gate 7, exposed portions of the gate dielectric 4 and tunnel dielectric 5 over semiconductor islands 2 and 3, and the surface of substrate 1. FIG. 4A is a cross-sectional view along axis A-A' of a structure as shown in FIG. 3A, and FIG. 4B is a cross-sectional view along axis B-B' of a structure as shown in FIG. 3A, with doped dielectric layer 8 printed or deposited thereon.

Generally, the dielectric film 8 contains a diffusible dopant. In one embodiment, the dopant is an N-type dopant, preferably comprising phosphorous. Alternatively, the diffusible dopant may comprise a P-type dopant, preferably comprising boron. Thus, in various embodiments of the present device, the control gate 2, the transistor island 3 (including source and drain terminals therein), and (optionally) the floating gate 7 may comprise (i) a Group IVA element, a III-V compound semiconductor such as GaAs, or a II-VI (or chalcogenide compound) semiconductor such as ZnO or ZnS, and (ii) a dopant element. Preferably, the semiconductor comprises a Group IV element (e.g., Si and/or Ge) and a dopant selected from the group consisting of B, P, As and Sb.

As shown in FIG. 4A, the doped dielectric film 8 may be printed such that contact holes 11 and 12 are formed in the dielectric film 8, to expose an upper surface of the gate dielectric 4 over the control gate 2 on opposed sides of the floating gate 7. Although not shown in FIGS. 4A-4B, similar contact holes are formed in the dielectric film 8 to expose an upper surface of the tunnel dielectric 5 over the semiconductor island 3 on opposed sides of the floating gate 7 (see, e.g., FIG. 5A). In other words, the pattern in which the doped dielectric layer 8 is printed includes a contact hole in such locations. However, as shown in FIG. 4B, the doped dielectric film 8 is generally printed onto the entire surface of the floating gate 7. The exposed gate dielectric 4 and tunnel dielectric 5 may then be etched (by either conventional wet or dry etching, as discussed below, and either before or after annealing to diffuse the dopant) to form structures 4' and 10 in FIG. 4A and expose a surface of control gate 2. In addition, during and/or after etching the gate dielectric 4 and tunnel dielectric 5, the doped dielectric layer 8 may also be etched sufficiently to widen the contact holes 11 and 12, preferably such that a dielectrically effective thickness of the doped dielectric layer 8 remains after etching.

Alternatively, the doped dielectric 8 may be printed in a pattern covering the entirety of the control gate 2, the transistor island 3, and the floating gate 7. In various embodiments, the doped dielectric layer 8 may be printed over an even larger area, comprising an entire memory cell (e.g., at least the layout of FIG. 5A) or a plurality of adjacent memory cells. After printing and annealing to diffuse the dopant (as explained below), the contact holes (e.g., 11 and 12 in FIG. 4A) are formed in the doped dielectric layer 8 to expose upper surface areas of the control gate 2 and source/drain terminals in the semiconductor island 3 (e.g., under and in electrical contact with metal interconnects/contacts 14 and 15 in FIG. 5A). Generally, in this alternative embodiment, the contact holes (e.g., 11 and 12 in FIG. 4A) are formed by photolithography and etching (see, e.g., the description in the following paragraph). Thus, forming contact holes 11 and 12 may comprise removing portions of a first and second type of dielectric layer 8, particularly when the printed pattern for doped dielectric 8 does not include any contact holes.

Etching of the doped glass pattern and gate dielectric is accomplished by exposure to one or more suitable etchants including, but not limited to, HF-based wet etchants (e.g., buffered oxide etch [BOE], native oxide etch [NOE], aq. pyridine:HF, etc.), HF-based or HF-producing vapors or gases, plasma etching, etc. The etchant is chosen such that the etch rate of the doped dielectric layer 8, the gate dielectric 4, and the tunnel dielectric 5 is sufficiently larger than the etch rate of the transistor island 3 (e.g., silicon) and control gate 2 to enable substantially complete removal of a desired and/or predetermined amount of the doped dielectric layer 8, the gate dielectric 4, and the tunnel dielectric 5 without substantial or significant removal of the transistor island 3 and control gate 2.

Suitable inks for printing the doped dielectric layer 8 include compounds and/or polymers containing dopant and/or dielectric precursor atoms such as phosphorous and oxygen (which may further include silicon, carbon, hydrogen and/or nitrogen), boron (which may further include silicon, carbon, hydrogen, oxygen and/or nitrogen), arsenic and/or antimony (either of which may further include silicon, carbon, hydrogen and/or oxygen), etc., optionally in a suitable solvent (see, e.g., U.S. Provisional Pat. Appl. No. 60/838,125 [filed on Aug. 15, 2006] and U.S. patent application Ser. Nos. 11/818,078, 11/888,949 and 11/888,942 [respectively], filed on Jun. 12, 2007, Aug. 3, 2007 and Aug. 3, 2007, respectively, the relevant portions of which are incorporated herein by reference). Exemplary phosphorous-containing dielectrics include:

inorganic oxophosphorous compounds and acids (e.g., $P_2O_3$, $P_2O_5$, $POCl_3$, etc.);
phosphosilicates;
monomeric, dimeric and/or oligomeric phosphates (e.g. meta- and/or polyphosphates);
phosphonates, phosphinates, and phosphines;
organic oxophosphorous compounds and acids (e.g., alkyl (aryl) phosphates, phosphonates, phosphinates and condensation products thereof); and
alkyl- and/or arylphosphonic and/or -phosphinic acids.

Exemplary boron-containing dielectrics include:
inorganic boron compounds and acids (e.g., boric acid, $B_2O_3$);
borosilicates, borazoles and polymers thereof;
boron halogenides (e.g., $BBr_3$);
boranes (e.g., $B_{10}H_{10}$), and sila- and/or azaboranes; and
organic boron compounds and acids (e.g. alkyl/aryl boronic acid, borates, boroxines and borazoles, borane addition complexes etc.).

Exemplary arsenic and/or antimony-containing dielectrics include:
oxo- and/or aza-analogs of the above compounds, such as $As_2O_3$ and $Sb_2O_3$; and
arsinosilanes, such as cyclo-$As_5(SiH_3)_5$.

Examples of precursors for the doped glass include conventional spin-on-dopant (SOD) formulations and versions thereof with increased viscosity (e.g., by replacing or diluting the solvent in the conventional formulation with a similar or compatible solvent of higher viscosity), doped molecular silicon ink formulations which can be oxidized at low temperatures (e.g. $\leqq 400°$ C.) after deposition (e.g. cyclic, linear or branched silane oligomers or polymers which may include one or more dopant substituents, such as cyclo-$Si_5H_9PR_2$, wherein R is lower [$C_1$-$C_4$] alkyl, phenyl or $C_1$-$C_4$-alkyl substituted phenyl, or a dopant precursor in the formulation [e.g. tert-butyl phosphine]; see U.S. patent application Ser. No. 10/949,013, filed on Sep. 24, 2004, the relevant portions of which are incorporated herein by reference), oxidized doped molecular silicon ink formulations (e.g. oxidized versions of cyclic, linear or branched silane oligomers or polymers (e.g., cyclo-$Si_5O_5H_{10}$) with dopant precursors in the formulation (e.g., mono-, di- or tri-tert-butylphosphine or oxidized analogs thereof) or dopant substituents thereon, glass forming formulations (e.g., so-called sol-gel formulations) containing phosphorous or boron compounds (e.g., organophosphates such as di-n-butylphosphate, or organoborates such as tri-t-butylborate, etc.).

Alternatively, if all devices on a single substrate can be made using a single dopant type (i.e., n-type or p-type dopant [s]), the doped dielectric 8 can be blanket deposited over substantially the entire substrate (e.g., by coating or other blanket deposition techniques, such as conventional spin-coating, blade coating, dip coating, meniscus coating, slot coating, or spray coating a spin-on glass [SOG] ink composition comprising one or more conventional SOG components, one or more conventional solvents therefor, and optionally one or more conventional surfactants, tension reducing agents, binders and/or thickening agents), liquid phase deposition of a doped $SiO_2$ precursor (such as a tetraalkylsiloxane or tetraalkoxysilane containing one or more of dopant/dielectric sources listed above), chemical vapor deposition (CVD, PECVD, LPCVD, etc.) or sputter deposition of another metal oxide(s) (e.g., $TiO_2$, $ZrO_2$, $HfO_2$, etc.) in the presence of a suitable and/or compatible dopant source, etc.

As mentioned above, the doped dielectric can be formed from a doped silane ink (as disclosed in the above-cited U.S. Patent Applications), which may be cured after printing in an oxidizing atmosphere. Such a doped silane ink can be directly inkjetted onto the substrate, islands and floating gate, as disclosed in U.S. Provisional Appl. No. 60/926,125, filed Apr. 24, 2007, the relevant portions of which are incorporated by reference).

After the doped dielectric 8 is printed (either with or without contact holes, the structure is annealed sufficiently to diffuse ("drive in") the dopant from doped dielectric film 8 into the floating gate 7 (when the floating gate 7 includes or consists essentially of polysilicon) and the semiconductor islands 2 and 3 (although the dopant may not diffuse completely in the regions of semiconductor islands 2 and 3 under floating gate 7). Preferably, annealing is conducted at a temperature and for a length of time sufficient to diffuse the dopant through the entire thickness of floating gate 7 and the regions of semiconductor islands 2 and 3 not covered by floating gate 7 (and thus, form source and drain terminals in transistor island 3). In another embodiment, the temperature and time are sufficient to activate at least some of the diffused dopant. Typically, annealing is conducted at a temperature of 750-1100° C., and in various implementations, at a maximum temperature of $\leqq 900°$ C., $\leqq 850°$ C., or $\leqq 800°$ C. Annealing generally comprises furnace annealing or rapid thermal annealing.

In such an implementation, the gate material and substrate are selected to be able to tolerate this temperature range. In a preferred embodiment, polysilicon gate 2, transistor island 3 and floating gate 7 can be automatically doped during thermal drive in/activation of dopant from the dielectric layer 8 into the silicon islands 2 and 3 and floating gate 7, resulting in n+ poly-to-nMOS or p+ poly-to-pMOS devices. Alternatively, the dopant may be driven into and/or activated in the semiconductor islands 2-3 and floating gate 7 by UV-lamp flash annealing or laser irradiation, using a wavelength of light and/or a light power sufficient to diffuse a dopant from the dielectric into the semiconductor and/or activate the dopant once in the semiconductor.

In the embodiment of FIGS. 4A-4B, where the gate dielectric layer 4 and tunnel dielectric layer 5 are on substantially the entire surface of semiconductor islands 2 and 3, dopant may be subsequently diffused through the dielectric layers 4 and 5 into the underlying semiconductor islands 2 and 3 to form doped semiconductor layer (e.g., 2' in FIG. 5B), including source/drain terminals in transistor island 3. In this embodiment, the dielectric layers 4 and 5 may cause a lower concentration and/or density of dopant to diffuse under the edges of the floating gate 7 (and in some cases to a shallower depth), resulting in an effect similar to lightly doped source/drain extensions (e.g., LDD's; see U.S. patent application Ser. No. 11/805,620, entitled "Graded Gate Field," and filed May 23, 2007, the relevant portions of which are incorporated herein by reference).

In certain embodiments, MOS transistors may be formed simultaneously with the present non-volatile memory cell. For example, MOS transistor channels may be formed (e.g., printed, cured, and crystallized) simultaneously with the plurality of semiconductor islands 2-3. MOS gate oxides may be formed simultaneously with forming the gate oxide 4 and/or tunnel oxide 5. Forming the floating gate 7 can also form gates in MOS transistors.

In one embodiment, CMOS transistors can be formed simultaneously with the present nonvolatile memory transistors by printing N- and P-dopants (in the form of doped dielectric inks such as those used to form dielectric layer 8), for example using inkjetting. Most preferably, the N- and P-dopants are inkjetted simultaneously into different areas of the circuit/substrate 1 from two sets of inkjet heads (e.g., 1 or more inkjet heads in each set for each type of dopant) mounted in the same printer, each set loaded with N- or P-dopant(s), respectively. Alternatively, N- and P-dopants may be printed in two alternate or separate processes and/or machines. In this latter embodiment, other printing or deposition technologies besides inkjetting, such as flexographic, offset lithographic, gravure, screen and stencil printing, slit and/or extrusion coating, etc., may be utilized. Simultaneous or sequential printing of complementary dopant materials (optionally in combination with an array type architecture for the gate layout) results in an ability to overcome resolution and drop placement accuracy issues associated with inkjet or other printing processes, allowing printing to substitute for relatively expensive masking layers, and eliminating other processing steps associated with photolithography.

The surface of one or more materials on which the doped dielectric 8 is printed (and/or the surface of any other material on which another material may be printed) may be modified to improve wetting, optimize adhesion, flow rates, etc. In addition, the doped dielectric ink formulation may be optimized to improve conformality over the floating gate 7 and/or the semiconductor islands 2-3. In general, one may (and typically does) leave the doped dielectric films 8 printed on the semiconductor layers 2-3 and the floating gate 7 in place as an interlayer dielectric (ILD). The present invention can eliminate multiple tools and multiple processing steps, reduce defects and cycle time (e.g., engineer-hours and/or technician-hours used for processing), and eliminate or reduce inventory.

Figure 5A:
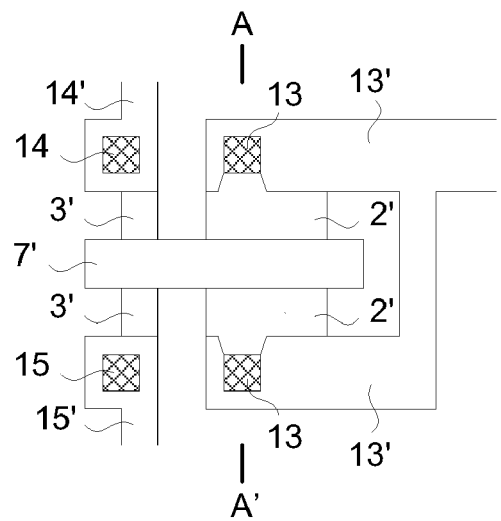
FIG. 5A shows a top-down view of an exemplary embodiment of a nonvolatile memory device according to the present invention.
Figure 5B:
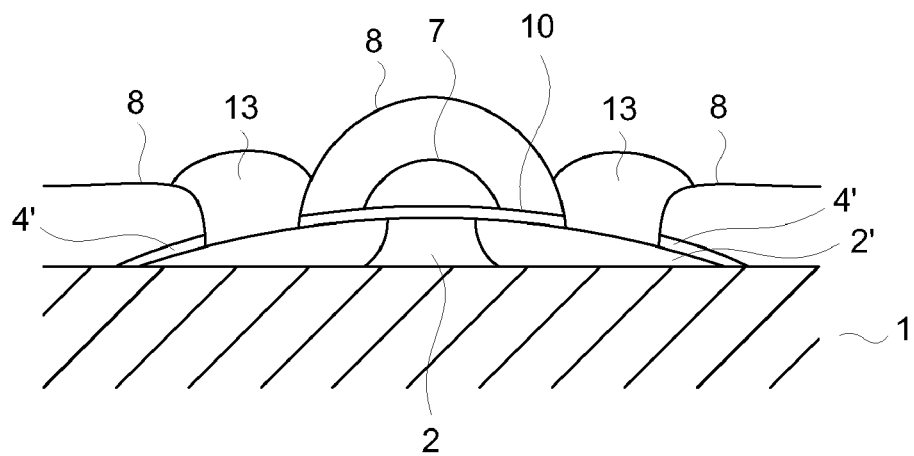
FIGS. 5B-5C show cross-sectional views of an exemplary embodiment of a nonvolatile memory device according to the present invention along the A-A' of FIG. 5A.

After etching, and an optional cleaning step, as shown in FIGS. 5A-5B, a metal layer (e.g., comprising contacts 13, 14 and 15 and metal interconnects 13', 14' and 15') is formed in contact with each exposed source/drain terminal of transistor island 3 and with an exposed upper surface of the doped control gate 2'. Preferably, forming metal layer 13-15' comprises printing a metal ink on the exposed surfaces of the source/drain terminals of the semiconductor island 3, the exposed surfaces of the control gate 2', and where applicable, the dielectric layer 8 and (optionally) second type of dielectric layer 8. The metal layer 13-15' preferably comprises aluminum, silver, gold, copper, palladium or platinum. The metal layer 13-15' may also be formed by electro- or electroless plating onto a printed metal/conductive seed layer.

Printing and/or forming the contact/interconnect metal 13-15' may include printing a suitable metal precursor (e.g., metal nanoparticles and/or organometallic compound(s), as described above) and converting it to the corresponding metal. Alternatively, a precursor for a seed layer may be printed on the contact and/or interconnect areas as described above, and the interconnect metal (e.g., Ag, Au, Cu, Pd, Pt, Al, etc.) can be electro- or electrolessly plated on the seed layer. Alternatively, patterning of the interconnect metal may include coating or printing the metal precursor and locally exposing it to laser radiation (e.g., "laser writing") such that its solubility characteristics change in the exposed areas. Upon washing away the soluble area (e.g., the exposed or unexposed area, depending on whether the solubility of the precursor is positively or negatively affected by such radiation), the appropriate metal precursor stays behind to form the contact/interconnect metal, optionally after an additional curing or annealing step. This laser writing embodiment may provide advantages for the patterning of high-resolution metal interconnect which may not directly be achievable with direct printing methods.

To ensure good electrical contact, the structure may furthermore be annealed to form a silicide at the interface with silicon, or throughout the entire film thickness of the contact areas between the metal 13-15 and the underlying silicon. Suitable silicide-forming metals include, but are not limited to, Al, Ni, Pd, Pt, Mo, W, Ti and Co. The contact/interconnect metal may be chosen from such silicide forming metals. Alternatively, the metal precursor ink may contain additives which form silicides or other low-resistance contacts to the silicon islands 2 and 3. For example, silver inks doped with a Ni organometallic compound have been observed to lower the contact resistance between a silver interconnect and doped silicon (e.g., source/drain) contacts. An analysis has also revealed that the Ni in such an ink has segregated to the silicon interface, presumably resulting in formation of a silicide.

Figure 5C:
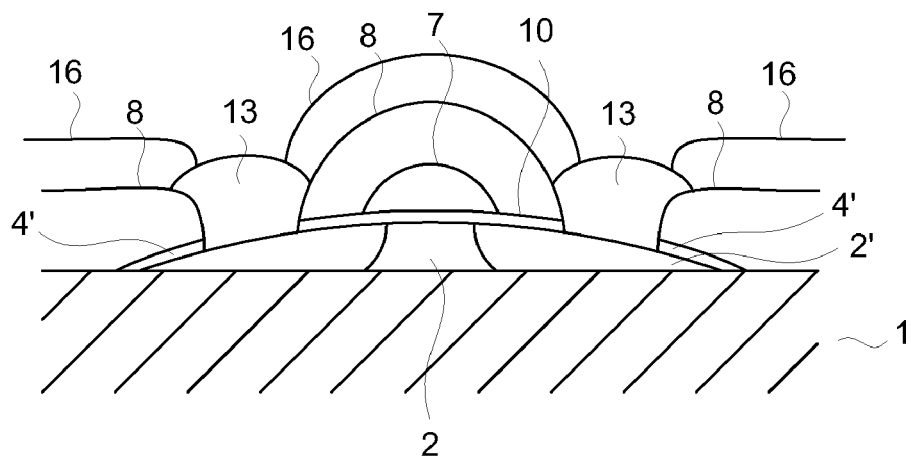

After printing the interconnect metal, an intermetal dielectric 16 (IMD) may be printed or blanket-deposited to cover the device, optionally leaving via holes in the appropriate areas (e.g., exposing at least a portion of metal contact/interconnect 13), as shown in FIG. 5C. The IMD precursor may comprise a glass-forming formulation (e.g., spin-on-glass formulations such as [organo]-silicates or -siloxanes), an organic dielectric (e.g. polyimide, BCB, etc.), an oxidized silicon precursor (e.g., an oxidized silane such as $Si_5O_5H_{10}$, etc.), or molecular- and/or nanoparticle-based silicon formulations (such as the [poly]- and/or [cyclo]silane inks described above, which can be oxidized after printing).

The technique(s) described herein are useful for manufacturing a variety of products, including RFID tags (e.g., where complementary dopant-containing dielectrics are printed and where a number of nonvolatile memory bits can be very useful for storing certain data, such as identification data and/or security code[s]) and display devices (e.g., for flat panel displays, electrophoretic displays, LCD displays and/or plasma displays where parts of the display may be printed with only one type of doped dielectric and where a number of nonvolatile memory bits can be very useful for storing certain data, such as configuration information), optionally combined with RF or RFID circuits. Furthermore, the present non-volatile memory cells can be used as field programmable devices. Sensors, optionally combined with RF or RFID circuits, can use the present programmable devices to permanently or temporarily store and/or quantify sensed information, identification information, and/or calibration data.

Figure 6A:
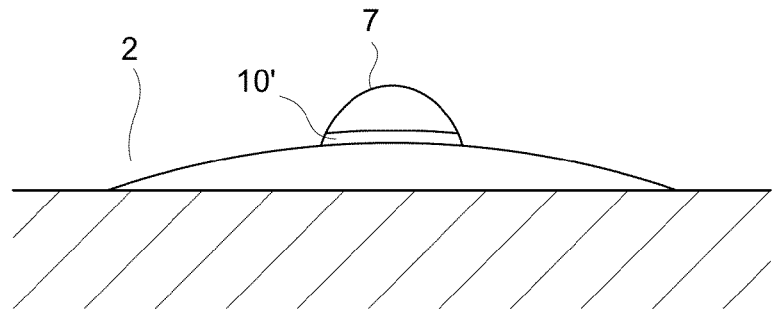
FIGS. 6A-6C show cross-sectional views of successive intermediate structures in an exemplary alternative process flow for making a nonvolatile memory device according to the present invention.
Figure 6B:
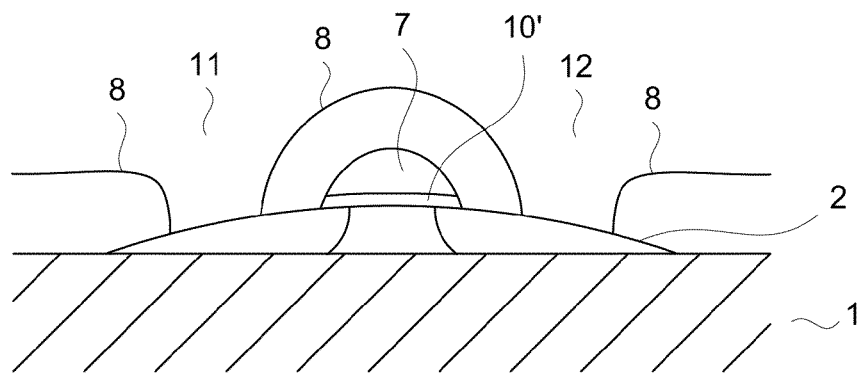
Figure 6C:
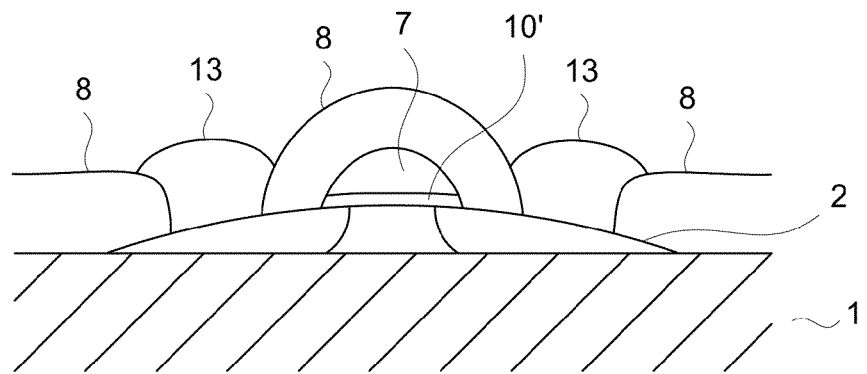

FIGS. 6A-6C show the alternative embodiment described above, in which portions of gate oxide 4 (and tunnel oxide 5, not shown in FIGS. 6A-6C) are removed prior to printing or depositing doped dielectric 8. FIGS. 6A-6C show a cross-section of the nonvolatile memory cell of FIG. 3A along axis A-A'.

As shown in FIG. 6A, etching the exposed gate dielectric 4 (see FIG. 3B) over control gate 2 forms an etched gate dielectric 10', located only under the floating gate 7. As shown in FIG. 6B, doped dielectric 8 is printed on floating gate 7 and exposed portions of control gate 2, either as a pattern forming contact holes 11 and 12, or over the entirety of floating gate 7 and control gate 2 (with contact holes 11 and 12 being etched therein after drive-in of the dopant from doped dielectric 8). Dopant is diffused from doped dielectric 8 into floating gate 7 and control gate 2 (and, although not shown, into transistor island 3) in the same manner as described above, but advantageously consuming less of a thermal budget (e.g., for a shorter time and/or at a lower temperature). Then, as shown in FIG. 6C, metal contacts/interconnects 13 are formed in contact holes 11 and 12 as described above.

Exemplary Operations for the Present Nonvolatile Memory

EPROM, EEPROM and flash memory technologies are based on a nonvolatile memory cell which comprises a source, channel, and drain with a floating gate over the channel and a control gate isolated from, but capacitively coupled to, the floating gate. The act of programming the cell to a predetermined state (other than an erased state) involves charging the floating gate with electrons, which causes the turn-on threshold of the memory cell to increase. Thus, when programmed, the cell will not turn on (or will turn on at a significantly or distinguishably higher threshold); that is, it will generally remain non-conductive (or detectably less conductive) when addressed with a read potential applied to its control gate. The act of erasing the cell involves removing electrons from the floating gate to lower the threshold to a base (e.g., binary "0") state. With the lower threshold, the cell may turn on to a fully conductive state when addressed with a read potential to the control gate.

Programming a flash, EPROM, or EEPROM cell is accomplished (on a row or byte-by-byte basis) through hot electron injection or Fowler-Nordheim (F-N) tunneling by establishing a large positive voltage between the gate and the source, and a positive voltage between the drain and the source. The act of discharging the floating gate is known as the erase step. This is accomplished generally through Fowler-Nordheim tunneling between the floating gate and the source (source erase) or between the floating gate and the substrate (channel erase). Source erasing may be performed by applying a positive bias to the source, while the gate is grounded or negatively biased. Channel erasing (e.g., on a block basis) may be performed by applying a negative bias to the gate and/or a positive bias to the substrate.

To program data into the present nonvolatile memory, both the source and the drain of transistor island 3 are held at a ground potential, and a positive voltage is applied to the control gate 2. In various embodiments, the positive voltage (Vpp) may be at least 12V (e.g., when the positive read or operating voltage, Vdd, is about 5V) preferably be at least 12V, and in certain embodiments, from 20V to 25V. A ground potential generally refers to a virtual ground potential or a voltage level of about 0V. Programming is believed to be effected by conventional electron injection. Alternatively, holes may be stored on the floating gate 7 by applying a negative voltage (e.g., −Vpp) to the control gate 2. In a further alternative embodiment, a reference cell, "unprogrammed" transistor, or transistor storing a "0" binary logic state may be programmed to a complementary binary logic state using a bias opposite to that of the programmed cell(s), leading to a greater delta $V_t$ between the programmed-unprogrammed cell pairs (e.g., the complementary binary logic states). The greater threshold voltage difference enhances the margin over which the cells are functional, increases data retention time, and/or allows read operations under less stringent (e.g., subthreshold swing) conditions.

To read data from the present nonvolatile memory cell, a first positive voltage is applied to the control gate 2, a second positive voltage is applied to the drain, and the source is held at a ground potential. In one preferred embodiment, the first and second positive voltages are conventional read voltages (e.g., Vdd) less than Vpp, generally of from about 1.5 to 9V, or any range of values therein (e.g., from about 3 to about 5V).

To erase data from the present nonvolatile memory cell, the inverse of the programming operation is performed. In other words, if the nonvolatile memory cell is programmed by applying a positive voltage to the control gate 2, the erasing operation applies a negative voltage of about the same magnitude to the control gate 2 while the source and drain of transistor island 3 are held at a ground potential. Alternatively, if the nonvolatile memory cell is programmed by applying a negative voltage to the control gate 2, the erasing operation applies a positive voltage of about the same magnitude to the control gate 2 while the source and drain of transistor island 3 are held at a ground potential.

Figure 7:
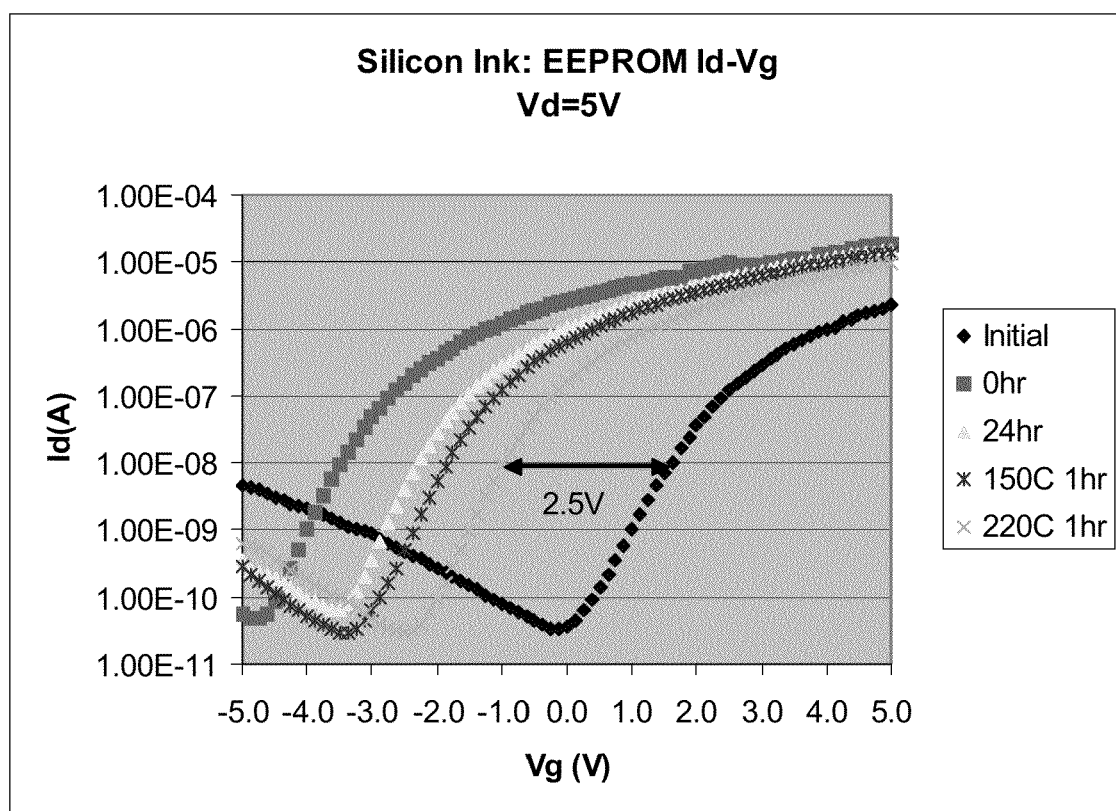
FIG. 7 is a graph showing retention data for an exemplary EEPROM cell, in which the channel island/control gate layer was formed from a spin-coated silicon-containing ink.

FIG. 7 shows retention data for a nonvolatile memory cell actually reduced to practice in accordance with embodiments in the above description. The use of sequential lateral laser solidification and/or crystallization on printed islands of silicon advantageously improves carrier mobility and gate/tunnel oxide interface quality. In turn, such improvements significantly improve the TFT subthreshold slope (steeper turn on characteristics; see FIG. 7), which allows for a better separation between the zero and one states in binary nonvolatile memory cells and between adjacent states in non-binary nonvolatile memory cells. Device feasibility has been demonstrated with excellent retention using a spun-on silicon ink (to form a semiconductor layer corresponding to semiconductor islands 2-3) and a conventional and/or standard TFT process flow (e.g., as described in one or more of the above-cited patent applications), with no extra processing steps required.

CONCLUSION/SUMMARY

The present invention advantageously provides a low cost method for manufacturing nonvolatile memory cells in MOS or thin film devices integrated circuits using printing technologies and including a doped dielectric film. The present nonvolatile memory cells have reliable, commercially acceptable electrical characteristics (e.g., on/off speeds and ratios, carrier mobilities, $V_t$'s, etc.). Printed and/or radiation-defined semiconductor structures (and, optionally, printed and/or radiation-defined conductor structures) may provide results similar to structures formed by more conventional approaches, but at a much lower cost and at a much higher throughput (on the order of hours to days, as opposed to weeks to months) than conventional semiconductor process technology.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:
1. A non-volatile memory cell, comprising:
 a) first and second printed semiconductor islands having a dome-shaped and/or rounded cross-sectional profile, at a same horizontal level and spaced a predetermined distance apart, the first printed semiconductor island comprising a control gate of said non-volatile memory cell and the second printed semiconductor island comprising source and drain terminals of said non-volatile memory cell;
b) a gate dielectric layer on at least part of said first semiconductor island;
c) a tunneling dielectric layer on at least part of said second semiconductor island;
d) a floating gate on at least part of said gate dielectric layer and said tunneling dielectric layer; and
e) a metal layer in electrical contact with said control gate and said source and drain terminals.

2. The non-volatile memory cell of claim 1, wherein each of said first and second semiconductor islands comprises a Group IVA element.

3. The non-volatile memory cell of claim 2, wherein said Group IVA element comprises silicon.

4. The non-volatile memory cell of claim 3, wherein each of said first and second semiconductor islands further comprises a dopant.

5. The non-volatile memory cell of claim 1, wherein each of said first and second semiconductor islands has an area defined by a width and a length, and the width and/or length of said first semiconductor island is substantially equal to at least one of said width and/or length of said second semiconductor island.

6. The non-volatile memory cell of claim 1, wherein said gate dielectric layer and said tunneling dielectric layer are conformal to said semiconductor islands.

7. The non-volatile memory cell of claim 6, wherein said floating gate has a dome-shaped and/or rounded cross-sectional profile.

8. The non-volatile memory cell of claim 1, wherein said gate dielectric layer comprises a first oxide and said tunneling dielectric layer comprises a second oxide different from said first oxide.

9. The non-volatile memory cell of claim 1, wherein said floating gate comprises a doped Group IVA element, a metal silicide or a refractory metal.

10. The non-volatile memory cell of claim 1, further comprising a dielectric film on said first and second printed semiconductor islands and said floating gate, said dielectric film containing a diffusible dopant.

11. The non-volatile memory cell of claim 10, further comprising contact holes in the dielectric film, exposing at least part of an upper surface of the underlying control gate and portions of the source and drain.

12. The non-volatile memory cell of claim 1, wherein said floating gate is continuous.

13. The non-volatile memory cell of claim 1, wherein said floating gate has a length of from about 1 μm to about 1,000 μm.

14. The non-volatile memory cell of claim 1, wherein said floating gate has a minimum gate width of about 5 microns.

15. The non-volatile memory cell of claim 1, further comprising a doped dielectric layer on portions of the floating gate, the gate dielectric layer, and/or the tunneling dielectric layer.

16. The non-volatile memory cell of claim 1, wherein said metal layer comprises aluminum, silver, gold, copper, palladium, or platinum.

17. The non-volatile memory cell of claim 1, further comprising an intermetal dielectric layer covering the non-volatile memory cell, the intermetal dielectric layer having one or more via holes therein.

18. The non-volatile memory cell of claim 17, wherein said metal layer electrically contacts the control gate and the source and drain terminals through contact holes in the intermetal dielectric layer.

19. An integrated circuit, comprising:
a) non-volatile memory cell of claim 1; and
b) a MOS transistor comprising:
   i) a third printed semiconductor island, at the same horizontal level as the first and second printed semiconductor islands;
   ii) a MOS gate dielectric on at least part of said third semiconductor island; and
   iii) a gate electrode on at least part of said MOS gate dielectric.

20. The integrated circuit of claim 19, wherein said MOS gate dielectric has a thickness different from a thickness of at least one of said tunneling dielectric layer and said gate dielectric layer.

* * * * *